(12) United States Patent
Lin et al.

(10) Patent No.: US 8,310,013 B2
(45) Date of Patent: Nov. 13, 2012

(54) METHOD OF FABRICATING A FINFET DEVICE

(75) Inventors: Hsien-Hsin Lin, Hsin-Chu (TW); Tsz-Mei Kwok, Hsinchu (TW); Chien-Chang Su, Kaohsiung (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 222 days.

(21) Appl. No.: 12/703,918

(22) Filed: Feb. 11, 2010

(65) Prior Publication Data

US 2011/0193141 A1    Aug. 11, 2011

(51) Int. Cl.
*H01L 27/088* (2006.01)

(52) U.S. Cl. ......................................... 257/401

(58) Field of Classification Search ............... 257/401
See application file for complete search history.

(56) References Cited

U.S. PATENT DOCUMENTS

| | | | |
|---|---|---|---|
| 6,706,571 B1 | 3/2004 | Yu et al. | |
| 6,770,516 B2 | 8/2004 | Wu et al. | |
| 6,858,478 B2 | 2/2005 | Chau et al. | |
| 6,885,055 B2 * | 4/2005 | Lee | 257/308 |
| 7,187,046 B2 | 3/2007 | Wu et al. | |
| 7,190,050 B2 | 3/2007 | King et al. | |
| 7,247,887 B2 | 7/2007 | King et al. | |
| 7,265,008 B2 | 9/2007 | King et al. | |
| 7,427,794 B2 * | 9/2008 | Chau et al. | 257/333 |
| 7,449,373 B2 * | 11/2008 | Doyle et al. | 438/149 |
| 7,508,031 B2 | 3/2009 | Liu et al. | |
| 7,528,465 B2 | 5/2009 | King et al. | |
| 7,605,449 B2 | 10/2009 | Liu et al. | |
| 7,622,773 B2 * | 11/2009 | Irisawa et al. | 257/347 |
| 8,021,949 B2 * | 9/2011 | Cheng et al. | 438/302 |
| 2004/0150029 A1 * | 8/2004 | Lee | 257/308 |
| 2005/0153490 A1 | 7/2005 | Yoon et al. | |
| 2005/0199948 A1 * | 9/2005 | Lee et al. | 257/327 |
| 2005/0199950 A1 * | 9/2005 | Chau et al. | 257/328 |
| 2007/0120156 A1 | 5/2007 | Liu et al. | |
| 2007/0122953 A1 | 5/2007 | Liu et al. | |
| 2007/0122954 A1 | 5/2007 | Liu et al. | |
| 2007/0128782 A1 | 6/2007 | Liu et al. | |
| 2007/0132053 A1 | 6/2007 | King et al. | |

(Continued)

OTHER PUBLICATIONS

C. E. Smith et al., "Dual Channel FinFET's as a Single High-K/Metal Gate Solution Beyond 22nm Node", Sematech, 97-4244-5640-6/09/ $26.00, 2009, IEEE, pp. 12.6.1-12.6.4.

(Continued)

*Primary Examiner* — N Drew Richards
*Assistant Examiner* — Grant Withers
(74) *Attorney, Agent, or Firm* — Haynes and Boone, LLP

(57) ABSTRACT

A FinFET device and method for fabricating a FinFET device is disclosed. An exemplary FinFET device includes a substrate of a crystalline semiconductor material having a top surface of a first crystal plane orientation; a fin structure of the crystalline semiconductor material overlying the substrate; a gate structure over a portion of the fin structure; an epitaxy layer over another portion of the fin structure, the epitaxy layer having a surface having a second crystal plane orientation, wherein the epitaxy layer and underlying fin structure include a source and drain region, the source region being separated from the drain region by the gate structure; and a channel defined in the fin structure from the source region to the drain region, and aligned in a direction parallel to both the surface of the epitaxy layer and the top surface of the substrate.

19 Claims, 18 Drawing Sheets

U.S. PATENT DOCUMENTS

| | | | |
|---|---|---|---|
| 2007/0228372 | A1 | 10/2007 | Yang et al. |
| 2007/0241399 | A1* | 10/2007 | Irisawa et al. ............... 257/347 |
| 2008/0048262 | A1* | 2/2008 | Lee et al. .................. 257/347 |
| 2008/0135888 | A1* | 6/2008 | Lee et al. .................. 257/255 |
| 2008/0258228 | A1 | 10/2008 | Chuang et al. |
| 2008/0263492 | A1 | 10/2008 | Chuang et al. |
| 2008/0290470 | A1 | 11/2008 | King et al. |
| 2008/0296632 | A1 | 12/2008 | Moroz et al. |
| 2009/0035909 | A1 | 2/2009 | Chang et al. |
| 2009/0181477 | A1 | 7/2009 | King et al. |
| 2010/0006945 | A1 | 1/2010 | Merelle et al. |
| 2010/0006974 | A1 | 1/2010 | Xu et al. |
| 2010/0052059 | A1 | 3/2010 | Lee |
| 2010/0183961 | A1 | 7/2010 | Shieh et al. |
| 2010/0203734 | A1 | 8/2010 | Shieh et al. |
| 2010/0264468 | A1 | 10/2010 | Xu |

OTHER PUBLICATIONS

Barliomiej Jan Pawlak, et al., U.S. Appl. No. 12/569,689, "Method of Fabricating Finfet Device," filed Sep. 29, 2009, 21 pages.

Chien-Chang Su, et al., U. S. Appl. No. 12/644,869, "Method for Incorporating Impurity Element in EPI Silicon Process," filed Dec. 22, 2009, 21 pages.

Tsung-Lin Lee, et al., U.S. Appl. No. 12/622,038, "Sacrificial Offset Protection Film for a Finfet Device," filed Nov. 19, 2009, 56 pages.

Jeff J. Xu, et al., U.S. Appl. No. 12/784,207, "Method of Forming EPI Film in Substrate Trench," filed May 20, 2010, 33 pages.

Tian-Choy, et al., U.S. Appl. No. 12/756,552, "Hybrid Gate Process for Fabricating Finfet Device," filed Apr. 8, 2010, 38 pages.

Ming-Lung Cheng, et al. U.S. Appl. No. 12/780,124, "Method and Apparatus for Enhancing Channel Strain," filed May 14, 2010, 35 pages.

Jhon Jhy Liaw, U.S. Appl. No. 12/823,907, "Cell Structure for Dual-Port SRAM," filed Jun. 25, 2010, 46 pages.

Jhon Jhy Liaw, U.S. Appl. No. 12/827,406, "Rom Cell Circuit for Finfet Devices," filed Jun. 30, 2010, 32 pages.

Jhon Jhy Liaw, U.S. Appl. No. 12/823,860, "Structure and Method for SRAM Cell Circuit," filed Jun. 25, 2010, 37 pages.

Jhon Jhy Liaw, et al., U.S. Appl. No. 12/827,690, "Layout for Multiple-Fin SRAM Cell," filed Jun. 30, 2010, 35 pages.

Jeng-Jung Shen, et al., U.S. Appl. No. 12/780,060, "Automatic Layout Conversion for Finfet Device," filed May 14, 2010, 29 pages.

Jeng-Jung Shen, et al., U.S. Appl. No. 12/780,426, "Finfet Boundary Optimization," filed May 14, 2010, 28 pages.

Yu-Lien Huang, et al., U.S. Appl. No. 12/840,830, "High Surface Dopant Concentration Semiconductor Device and Method of Fabricating," filed Jul. 21, 2010, 21 pages.

Peng-Soon Lim, et al., U.S. Appl. No. 12/827,512, "Gate Structures and Method of Fabricating Same," filed Jun. 30, 2010, 41 pages.

Tsu-Hsiu Perng, et al., U.S. Appl. No. 12/837,093, "Fin-Like Field Effect Transistor (Finfet) Device and Method of Manufacturing Same," filed Jul. 15, 2010, 30 pages.

Clement Hsingjen Wann, et al., U.S. Appl. No. 12/834,617, "In-Situ Spectrometry," filed Jul. 12, 2010, 20 pages.

Chia-Chung Chen, et al., U.S. Appl. No. 12/871,476, "Gate Controlled Bipolar Junction Transistor on Fin-Like Field Effect Transistor (Finfet) Structure," filed Aug. 30, 2010, 30 pages.

Jeff J. Xu, et al, U.S. Appl. No. 12/906,820, "Fin-Like Field Effect Transistor (Finfet) Device and Method of Manufacturing Same," filed Oct. 18, 2010, 55 pages.

Jeff J. Csu, et al, U.S. Appl. No. 12/917,902, "Fin-Like Field Effect Transistor (FINFET) Device and Method of Manufacturing Same," filed Nov. 2, 2010, 61 pages.

Mark van Dal, U.S. Appl. No. 12/900,895, "Method of Fabricating a Semiconductor Device Having an Epitaxly Region," filed Oct. 8, 2010, 21 pages.

Hsin-Chih Chen, et al, U.S. Appl. No. 12/907,272, "Multi-Fin Device by Self-Aligned Castle Fin Formation," filed Oct. 19, 2010, 34 pages.

Chien-Hsun Wang, et al, U.S. Appl. No. 12/952,376, "Method for Adjusting Fin Width in Integrated Circuitry," filed Nov. 23, 2010, 27 pages.

Chien-Shun Wang, et al, U.S. Appl. No. 12/949,881, "Method for Forming Metrology Structures From Fins in Integrated Circuitry," filed Nov. 19, 2010, 16 pages.

Chien-Hsun Wang, et al, U.S. Appl. No. 12/953,148, "Device and Method for Forming Fins in Integrated Circuitry," filed Nov. 23, 2010, 39 pages.

* cited by examiner

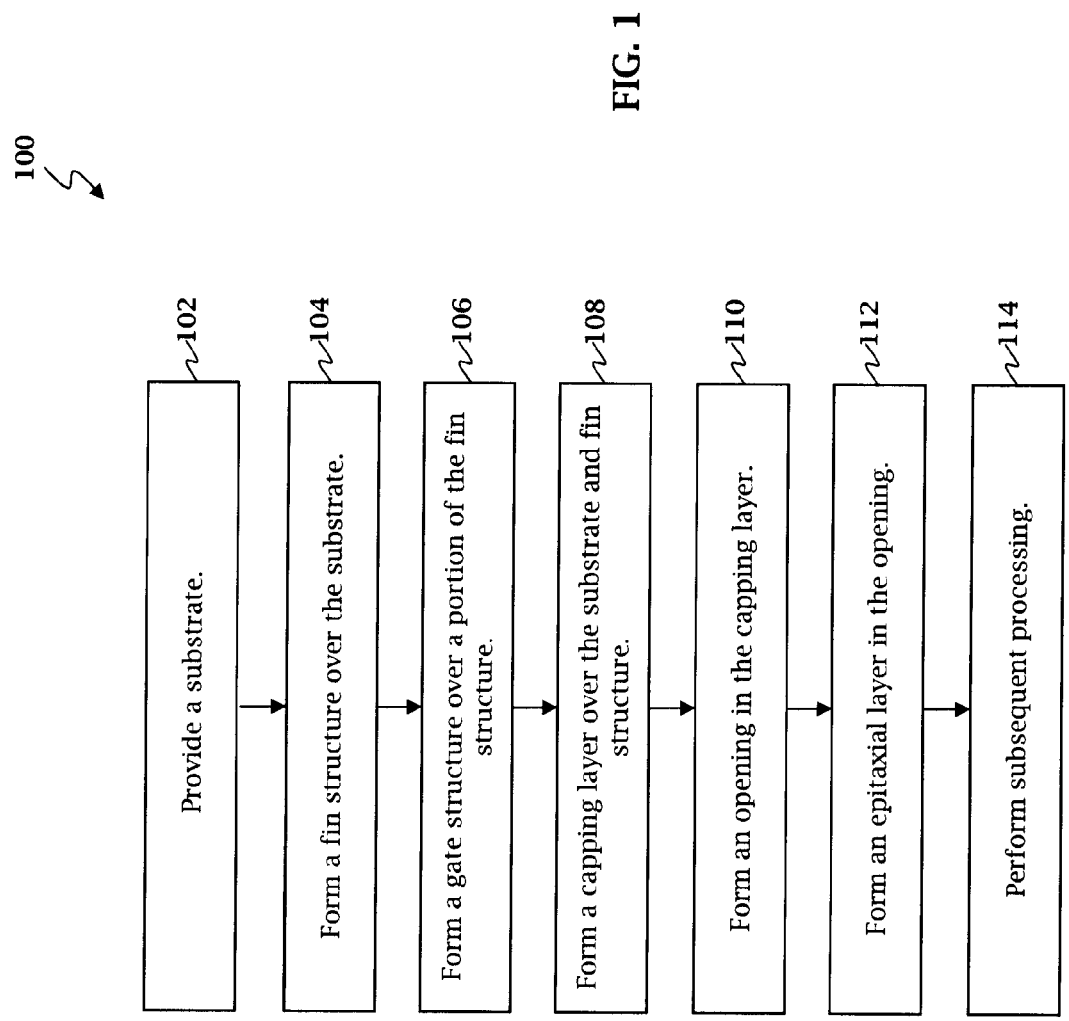

METHOD OF FABRICATING A FINFET DEVICE

BACKGROUND

As the semiconductor industry has progressed into nanometer technology process nodes in pursuit of higher device density, higher performance, and lower costs, challenges from both fabrication and design issues have resulted in the development of three dimensional designs, such as a fin-like field effect transistor (FinFET). A typical FinFET is fabricated with a thin "fin" (or fin structure) extending from a substrate, for example, etched into a silicon layer of the substrate. The channel of the FET is formed in this vertical fin. A gate is provided over (e.g., wrapping) the fin. It is beneficial to have a gate on both sides of the channel allowing gate control of the channel from both sides. Further advantages of FinFET devices include reducing the short channel effect and higher current flow.

As device structures become more dense, there have been problems associated with fabrication of FinFET devices. For example, conventional FinFET device fabrication methods are unable to provide varied profiles, such as a square profile, of facets (e.g., Si or SiGe facets) of the fin structure. Simply changing various process settings has proved incapable of significantly improving the ability to fabricate varied profiles. The facet profile affects a contact salicidation area, which in conventional FinFET devices may be smaller than desirable, resulting in higher than desirable salicide contact resistance, and thus poor device performance. Further, in conventional FinFET device fabrication methods, a fin structure height is limited by a fin structure width, for example, because of faceting. As devices become smaller, the fin structure height limitation further exacerbates the shrinking contact salicidation area issue. Accordingly, an improved FinFET device and improved method for fabricating a FinFET device is desired.

SUMMARY

The present disclosure provides for many different embodiments. An exemplary FinFET device can include a substrate of a crystalline semiconductor material having a top surface of a first crystal plane orientation; a fin structure of the crystalline semiconductor material overlying the substrate; a gate structure over a portion of the fin structure; an epitaxy layer over another portion of the fin structure, the epitaxy layer having a surface having a second crystal plane orientation, wherein the epitaxy layer and underlying fin structure include a source and drain region, the source region being separated from the drain region by the gate structure; and a channel defined in the fin structure from the source region to the drain region, and aligned in a direction parallel to both the surface of the epitaxy layer and the top surface of the substrate.

Another exemplary FinFET device fabricated by the methods described herein can include a substrate including a fin structure, wherein the substrate is crystalline silicon and has a top surface with a first crystallographic plane orientation; a gate structure disposed on a portion of the fin structure, the gate structure traversing the fin structure; an epitaxy layer formed over another portion of the fin structure, wherein the epitaxy layer has first, second, and third surfaces, the first surface being parallel to the top surface of the substrate, and the second and third surfaces being perpendicular to the first surface and having a second crystallographic plane orientation; and a source and drain region in the epitaxy layer that defines a channel in the fin structure from the source region to the drain region, the channel being aligned in a direction defined by an intersection line between the first surface and the second surface.

Yet another exemplary FinFET device includes a semiconductor substrate having a fin structure disposed thereover, the fin structure having a top surface parallel to a top surface of the semiconductor substrate, the top surfaces having a (001) crystal plane orientation; a gate structure traversing the fin structure, the gate structure separating a source region and a drain region of the fin structure, wherein the source and drain region define a channel therebetween and aligned in a <110> direction; and the source and drain region including an epitaxial layer having a top surface and two sidewall surfaces, wherein the top surface has a (001) crystal plane orientation, and the two sidewall surfaces can have a (110) crystal plane orientation.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIG. 1 is a flow chart of a method for fabricating an integrated circuit device according to aspects of the present disclosure.

DETAILED DESCRIPTION

Figure 2A:
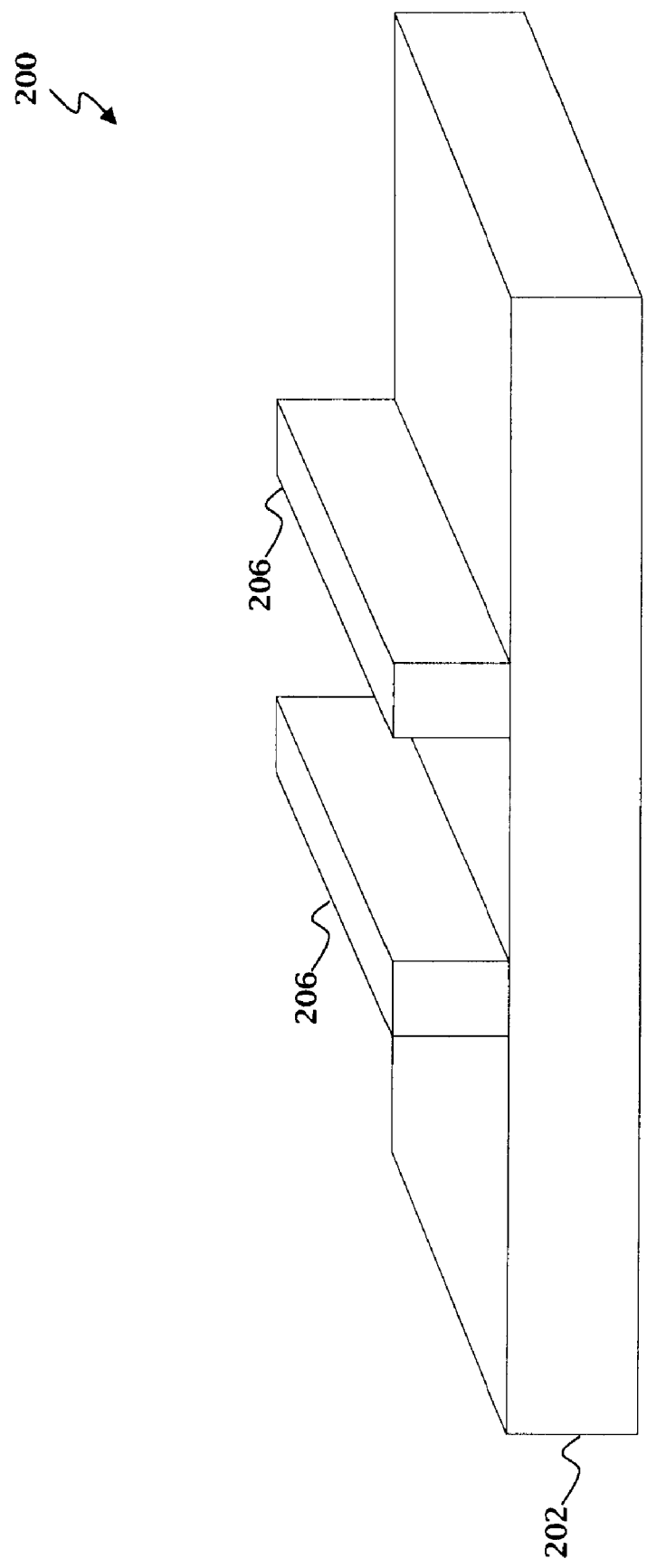
FIGS. 2A-2G are various cross-sectional views of embodiments of an integrated circuit device during various fabrication stages according to the method of FIG. 1.

The present disclosure relates generally to semiconductor devices, and more particularly, to a FinFET device and methods of fabricating a FinFET device (e.g., element or portion of a device/element).

It is understood that the following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

With reference to FIGS. 1, 2A-2G, 3, and 4A-4H, methods 100, 300 and semiconductor devices 200, 400 are collectively described below. The semiconductor devices 200, 400 illustrate a FinFET device (e.g., transistor) or any portion thereof (e.g., a fin). As employed in the present disclosure, the term FinFET device refers to any fin-based, multi-gate transistor. The FinFET devices 200, 400 may be included in a microprocessor, memory cell, and/or other integrated circuit devices. It is understood that additional steps can be provided before, during, and after the methods 100, 300, and some of the steps described below can be replaced or eliminated, for additional embodiments of the methods. It is further understood that additional features can be added in the semiconductor devices 200, 400, and some of the features described below can be replaced or eliminated, for additional embodiments of the semiconductor devices 200, 400.

FIG. 1 illustrates a flow chart of an embodiment of the method 100 to fabricate the FinFET device 200. Referring to FIGS. 1 and 2A, at block 102, a substrate (wafer) 202 is provided. The substrate 202 comprises silicon in a crystalline structure. The substrate 202 comprises any suitable crystallographic orientation (e.g., a (100), (110), or (111) crystallographic orientation). The substrate 202 may further include a notch aligned along any suitable direction (e.g., a <110> or <100> direction). In the present embodiment, the substrate 202 includes a top surface having a (001) crystalline (plane) orientation. In another embodiment, the substrate 202 includes a (001) crystallographic (plane) orientation with a notch aligned in a <110> direction. Alternatively, the substrate 202 comprises other suitable elementary semiconductors, such as germanium in crystal; a compound semiconductor, such as silicon carbide, gallium arsenic, gallium phosphide, indium phosphide, indium arsenide, and/or indium antimonide; or combinations thereof. Alternatively, the substrate 202 includes a silicon-on-insulator (SOI) substrate. The SOI substrate can be fabricated using separation by implantation of oxygen (SIMOX), wafer bonding, and/or other suitable methods. The substrate 202 may include isolation regions, various doped regions, other suitable features, and/or combinations thereof.

At block 104, a fin structure 206 is formed over the substrate 202. The exemplary fin structure 206 comprises one or more fins. The fins comprise any suitable material, for example, the fin structure 206 comprises one or more silicon fins (Si-fin). As illustrated in FIG. 2A, the fin structure 206 exhibits a rectangular shape with a top surface that is parallel to a top surface of the substrate 202. Accordingly, the top surface of the fin structure 206 may have a (001) crystallographic plane orientation, similar to the substrate 202. The rectangular-shaped fin structure 206 can also include a right and left sidewall surfaces perpendicular to the top surfaces of the fin structure 206 and/or substrate 202.

The fin structure 206 is formed by any suitable process including various deposition, photolithography, and/or etching processes. An exemplary photolithography process may include forming a photoresist layer (resist) overlying the substrate (e.g., on a silicon layer), exposing the resist to a pattern, performing a post-exposure bake process, and developing the resist to form a masking element including the resist. The masking element may then be used to etch the fin structure into the silicon layer. The fin structure may be etched using reactive ion etching (RIE) processes and/or other suitable processes. In an example, the fin structure 206 may be formed, for example, by etching a layer of silicon on the substrate. The layer of silicon may be a silicon layer of a SOI substrate (e.g., overlying an insulator layer). The fin structure 206 may further include a capping layer disposed on the fins. The capping layer may include a silicon capping layer. It is understood that multiple parallel fin structures may be formed in a similar manner.

Alternatively, the fin structure 206 is formed by a double-patterning lithography (DPL) process. DPL is a method of constructing a pattern on a substrate by dividing the pattern into two interleaved patterns. DPL allows enhanced feature (e.g., fin) density. Various DPL methodologies may be used including double exposure (e.g., using two mask sets), forming spacers adjacent features and removing the features to provide a pattern of spacers, resist freezing, and/or other suitable processes.

Figure 2B:
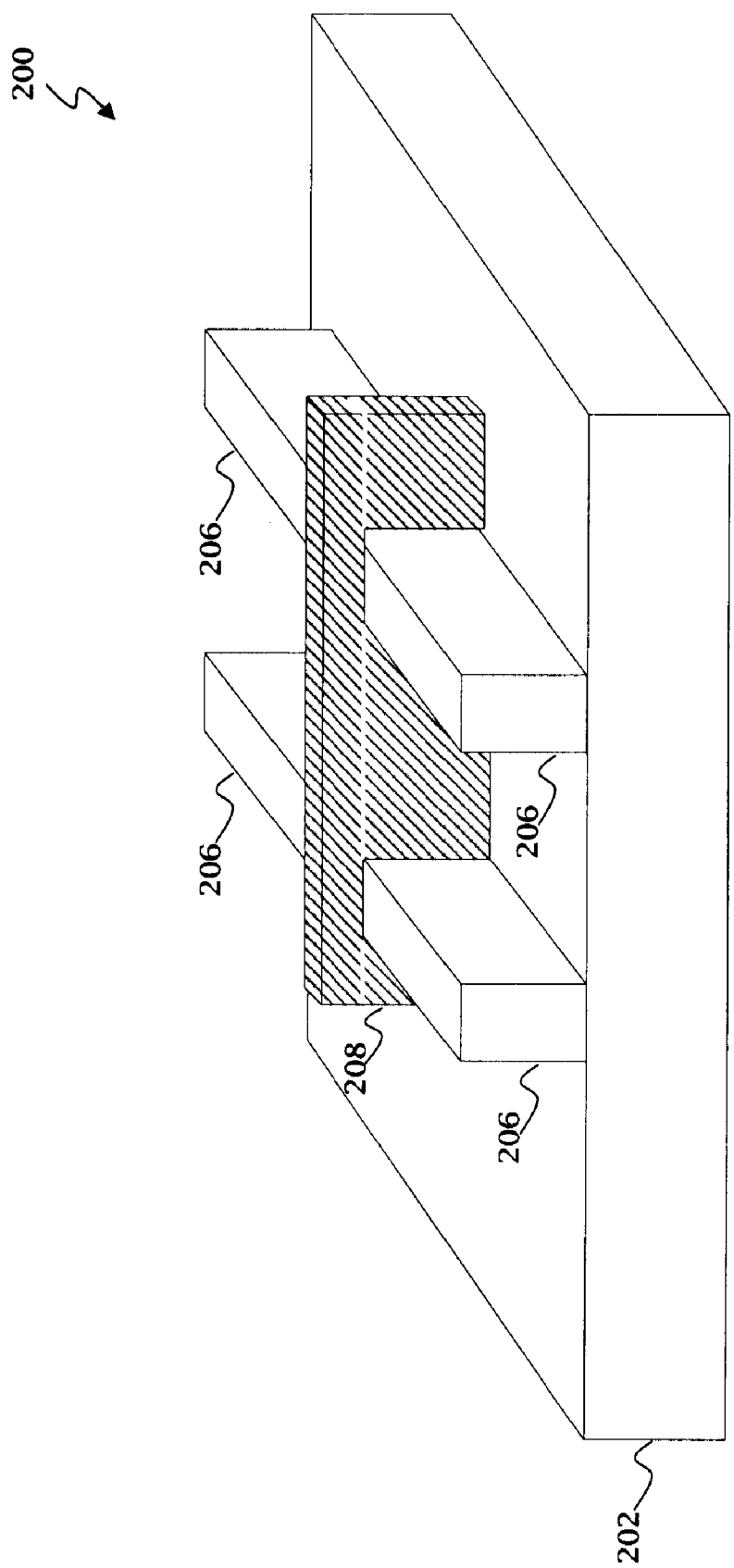

Referring to FIGS. 1 and 2B, at block 106, a gate structure 208 is formed over a portion of the fin structure 206. The gate structure 208 traverses the fin structure 206. In the present embodiment, the gate structure 208 is formed over a central portion of the fin structure 206. The gate structure 208 includes one or more material layers, such as interfacial layers, capping layers, diffusion/barrier layers, dielectric layers, electrode layers, conductive layers, other suitable layers, and/or combinations thereof. For example, the gate structure 208 may include a gate dielectric layer and a gate electrode. The gate dielectric layer comprises a dielectric material, such as silicon oxide, silicon nitride, high-k dielectric material, other suitable dielectric material, and/or combinations thereof. Examples of high-k dielectric material include $HfO_2$, HfSiO, HfSiON, HfTaO, HfTiO, HfZrO, zirconium oxide, aluminum oxide, hafnium dioxide-alumina ($HfO_2$—$Al_2O_3$) alloy, other suitable high-k dielectric materials, and/or combinations thereof. The gate electrode includes any suitable material, such as polysilicon, aluminum, copper, titanium, tantalum, tungsten, molybdenum, tantalum nitride, nickel silicide, cobalt silicide, TiN, WN, TiAl, TiAlN, TaCN, TaC, TaSiN, metal alloys, other suitable materials, and/or combinations thereof.

The gate structure 208 is formed by any suitable process. For example, the gate structure 208 is formed by a procedure including deposition, photolithography patterning, and etching processes. The deposition processes include chemical vapor deposition (CVD), physical vapor deposition (PVD), atomic layer deposition (ALD), high density plasma CVD (HDPCVD), metal organic CVD (MOCVD), remote plasma CVD (RPCVD), plasma enhanced CVD (PECVD), low-pressure CVD (LPCVD), atomic layer CVD (ALCVD), atmospheric pressure CVD (APCVD), plating, other suitable methods, and/or combinations thereof. The photolithography patterning processes include photoresist coating (e.g., spin-on coating), soft baking, mask aligning, exposure, post-exposure baking, developing the photoresist, rinsing, drying (e.g., hard baking), other suitable processes, and/or combinations thereof. Alternatively, the photolithography exposing process is implemented or replaced by other proper methods such as maskless photolithography, electron-beam writing, and ion-beam writing. The etching processes include dry etching, wet etching, and/or other etching methods (e.g., reactive ion etching).

Figure 2C:
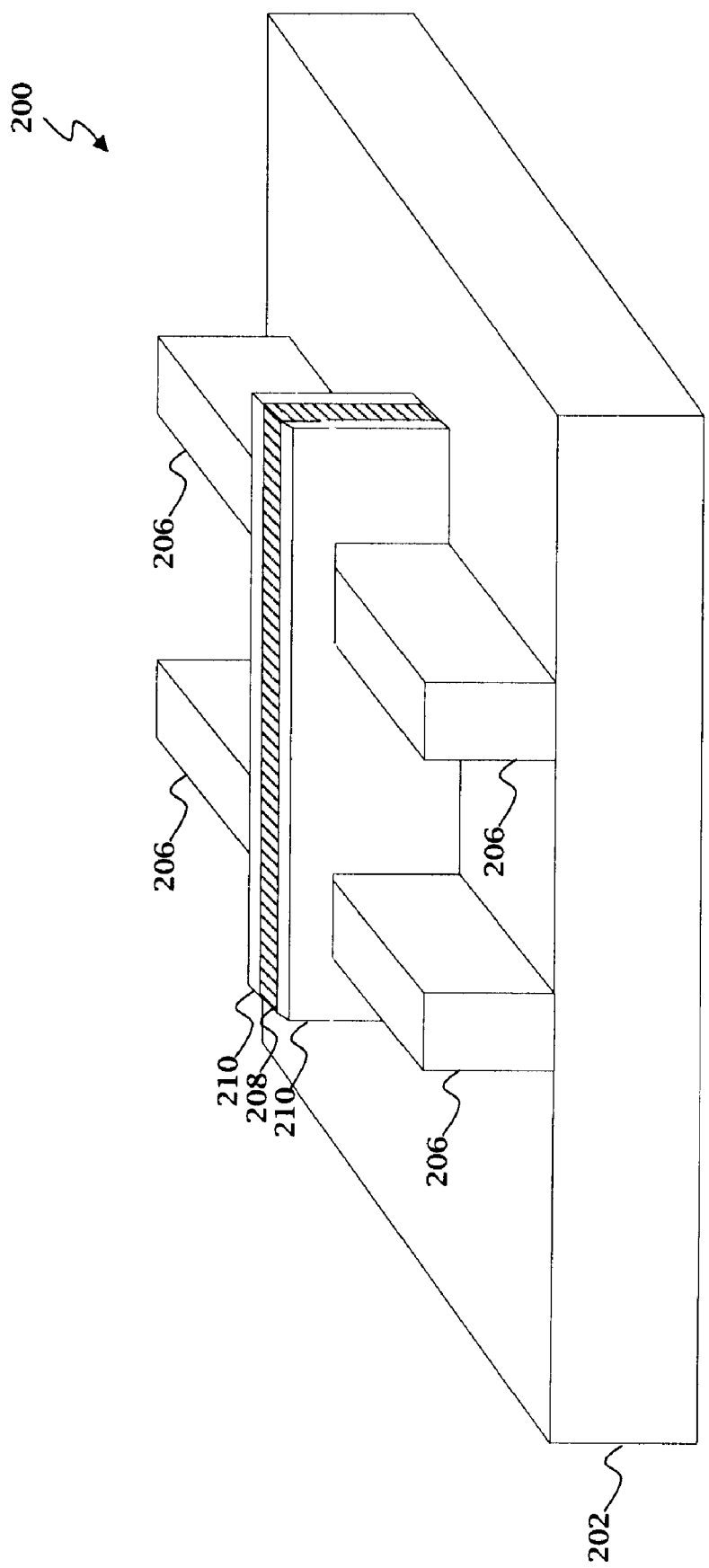

The gate structure 208 may further include spacers 210 as illustrated in FIG. 2C. The spacers 210 are formed by any suitable process to any suitable thickness. The spacers 210, which are positioned on each side of the gate structure 208, may comprise a nitride material (e.g., silicon nitride). In various examples, the spacers 210 comprise a dielectric material, such as silicon nitride, silicon carbide, silicon oxynitride, other suitable materials, and/or combinations thereof.

Various doped regions, such as source and drain (S/D) regions, can be formed in the fin structure 206. The S/D regions can include lightly doped S/D regions (LDD regions)

and/or heavily doped S/D regions (HDD regions). The gate structure 208 traversing the fin structure 206 can separate the various doped regions. For example, the gate structure 208 can separate a source region and a drain region of the fin structure 206. The doping species may depend on the type of device being fabricated, such as an NMOS or PMOS device. The doping species include p-type dopants, such as boron or $BF_2$; n-type dopants, such as phosphorus or arsenic; and/or combinations thereof. The S/D regions may comprise various doping profiles. The doped regions may be formed by implantation processes, diffusion process, and/or other suitable processes. One or more annealing processes may be performed to activate the S/D regions. The annealing processes comprise rapid thermal annealing (RTA), laser annealing processes, and/or other suitable annealing processes.

Figure 5A:
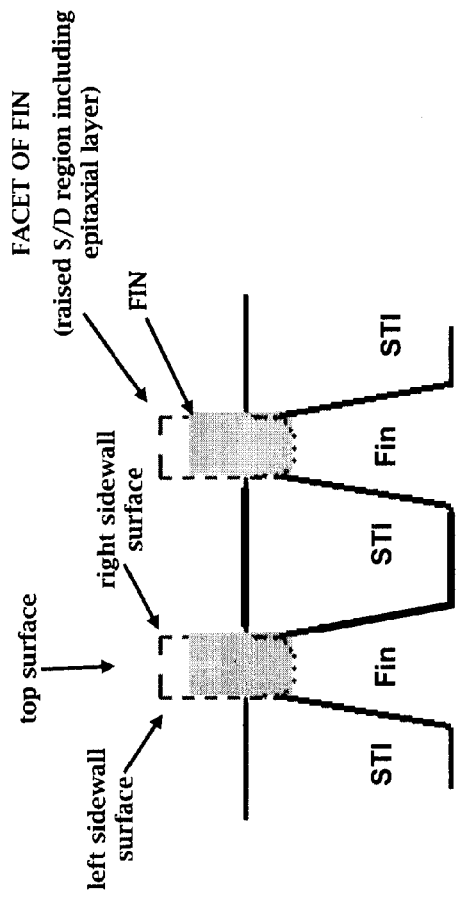
FIGS. 5A-5B illustrate various cross-sectional views along a channel of a fin structure according to one or more embodiments.

Conventional processing of the FinFET device 200 would continue with performing a selective epitaxial growth/deposition process to form raised source/drain regions comprising epitaxially grown silicon (Si) or silicon germanium (SiGe), which can also be referred to as facets of the fin structure (e.g., Si and SiGe facets). It has been observed that conventional facets of the fin structure, such as the Si and SiGe facets, are unable to exhibit a rectangular profile following conventional processing. More particularly, it has been observed that epitaxially growing Si and SiGe facets cannot form a rectangular profile on a silicon substrate having a (001) crystallographic orientation with a notch aligned in a <110> direction. For example, FIG. 5A is a cross-sectional view of a fin structure along a channel of the fin structure, where the facets of the fin structure exhibit a diamond shaped profile, which often occurs in conventional processing. When the facets are grown on a silicon substrate having a (001) crystallographic plane orientation, the diamond shaped profile of FIG. 5A may have a top (first) surface with a (001) crystal plane and right/left (second/third) sidewall surfaces with a (111) crystal plane. In other words, the substrate, channel, and facet each have a different crystallographic orientation (e.g., wafer (001)/channel (110)/facet (111)). Because conventional facets naturally grow in a diamond shape, fin structure height is limited by fin structure width. This adversely decreases an area available for later performed salicidation to form salicide contact areas, which also contributes to increased contact resistance. Improving the profile of the facets is difficult by varying process settings.

Figure 5B:
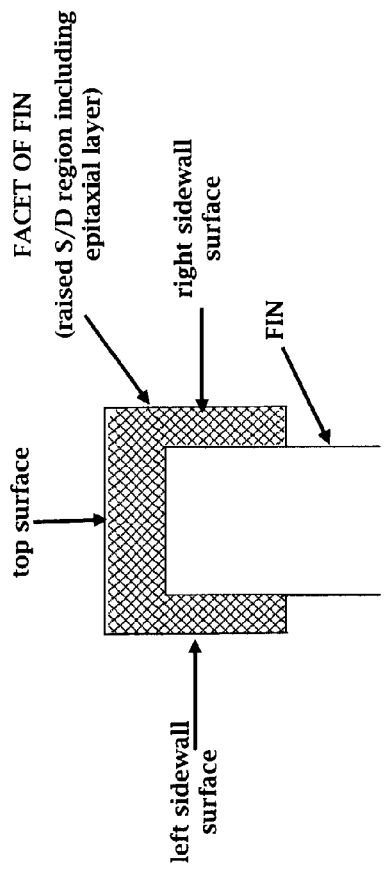

Accordingly, an improved method for providing improved facet profile control is desired. The present disclosure proposes utilizing a damascene process to form the facets of the fin structure, i.e., the raised source/drain regions of the FinFET device. The damascene process can be utilized to form unique and/or arbitrary profiles of the fin structure including the facets. For example, FIG. 5B is a cross-sectional view of a fin structure along a channel of the fin structure, where the fin structure including the facets of the fin structure exhibit a rectangular-shaped profile. The damascene process disclosed herein can utilize a capping layer that is patterned to define a desired facet profile. The capping layer can provide improved profile control (for example, by providing the ability to form facets having a rectangular profile, particularly Si and SiGe facets grown on a silicon substrate having a (001) crystallographic orientation) and increase/expand a salicidation area, which can reduce salicide contact resistance. The capping layer also eliminates fin structure height limitations, even as fin structure widths decrease. Unique facet profiles and/or arbitrary facet profiles are possible by forming epitaxial layers in an etched profile of the capping layer, forming defined facets (source/drain regions). It is understood that different embodiments may have different advantages, and that no particular advantage is necessarily required of any embodiment.

Figure 2D:
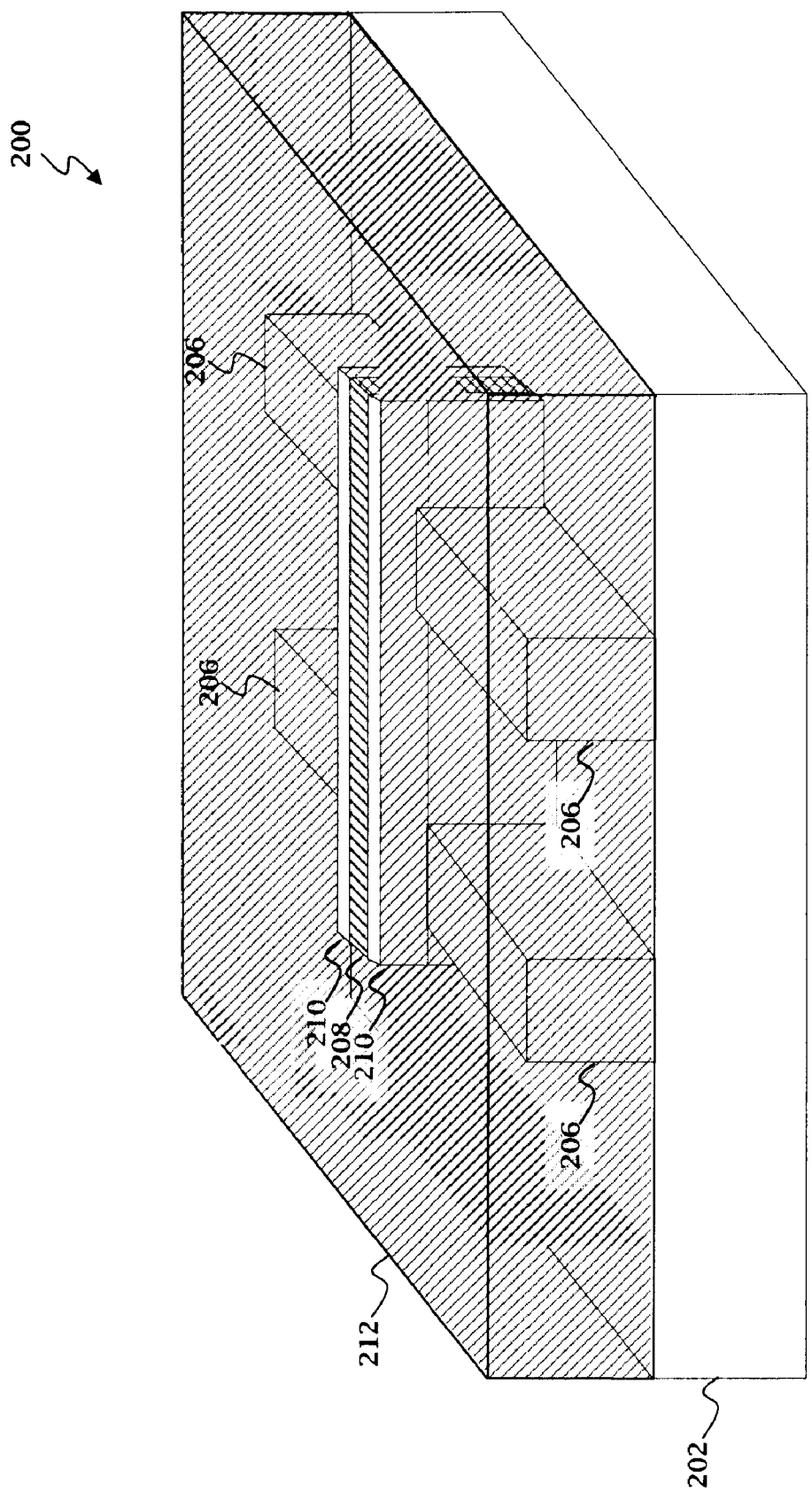

Referring to FIGS. 1 and 2D, at block 108, a capping layer is formed over the substrate and fin structure. In the present embodiment, a capping layer 212 is formed over the substrate 202, fin structure 206, and gate structure 208 (including spacers 210). The capping layer 212 comprises any suitable material. An exemplary capping layer 212 is an oxide capping layer, such as silicon oxide or silicon oxynitride (SiON). Alternatively, the capping layer 212 includes other suitable materials, such as silicon nitride, SiC, SiOC, spin-on glass (SOG), a low-k film, tetraethylorthosilicate (TEOS) formed oxide, plasma enhanced CVD oxide (PE-oxide), high-aspect-ratio-process (HARP) formed oxide, or other suitable material. The capping layer 212 is formed by any suitable deposition process. Subsequently, one or more chemical mechanical polishing (CMP) processes are performed to planarize the capping layer 212 as illustrated in FIG. 2D. For example, the CMP process is performed until a portion of the gate structure 208 and spacers 210 are reached (which may expose a top portion of the gate structure 208 and spacers 210).

Figure 2E:
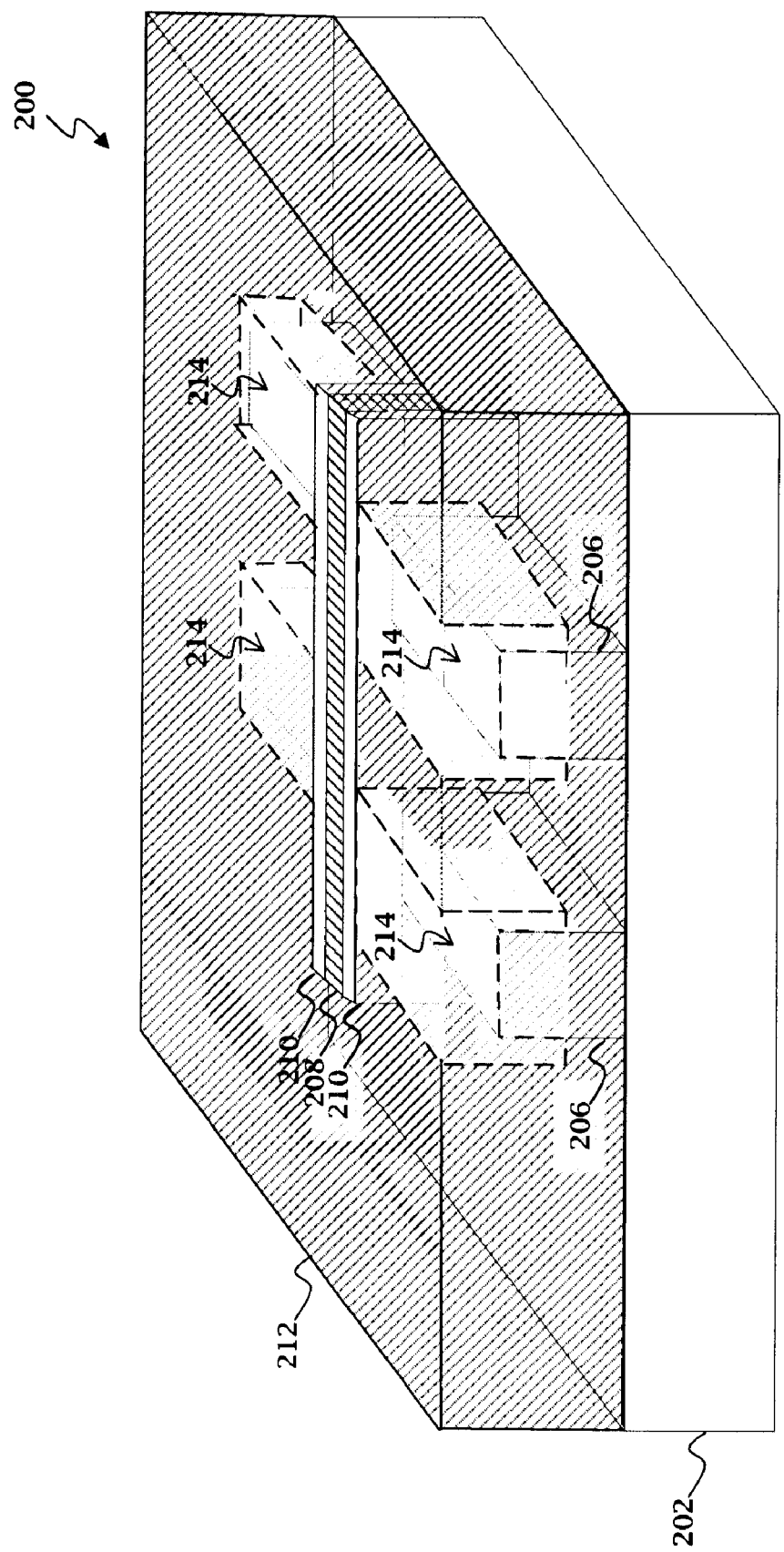

Referring to FIGS. 1 and 2E, at block 110, an opening is formed in the capping layer to define source and drain regions for the FinFET device 200. The source and drain regions may alternatively be referred to as facet portions of the fin structure 206, and thus, the opening in the capping layer defines a facet profile. For example, opening 214 is formed in the capping layer 212 by a combination of photolithography and etching processes. The opening 214 (comprising one or more openings in the present embodiment) defines source and drain (S/D) regions (or facet profiles) for the FinFET device 200. Thus, the capping layer 212 may be patterned to define various S/D (or facet) profiles. The opening 214 also exposes portions of the fin structure 206. The capping layer 212 may exhibit a different etching selectivity than the fin structure 206, such that etching of the capping layer 212 does not modify a profile of the fin structure 206 or damage the fin structure 206 (e.g., the fin structure 206 exhibits a higher etching resistance than the capping layer 212).

The photolithography patterning processes include photoresist coating (e.g., spin-on coating), soft baking, mask aligning, exposure, post-exposure baking, developing the photoresist, rinsing, drying (e.g., hard baking), other suitable processes, and/or combinations thereof. Alternatively, the photolithography exposing process is implemented or replaced by other proper methods such as maskless photolithography, electron-beam writing, and ion-beam writing. The etching processes include dry etching, wet etching, and/or other etching methods (e.g., reactive ion etching).

Figure 2F:
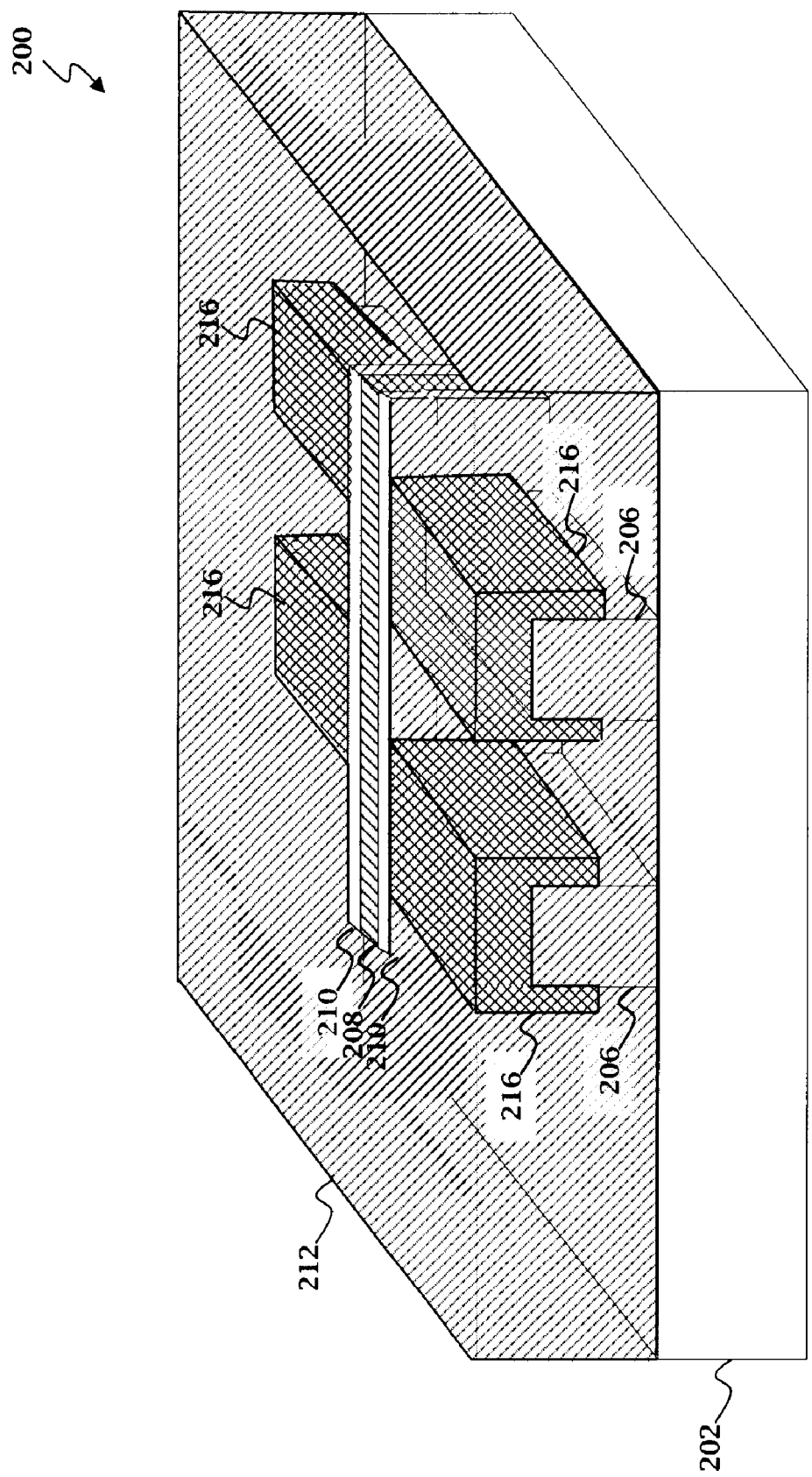

At block 112, raised source and drain regions are formed. For example, the opening 214 is filled with an epitaxial layer 216, which forms epitaxial layer 216 on the exposed portions of the fin structure 206 (e.g., source and drain regions of the fin structure 206) as illustrated in FIG. 2F. The epitaxial layer 216 is grown in regions by one or more epitaxy (epi) processes where the capping layer 212 has been removed (e.g., in the present embodiment, within the opening 214 over portions of the fin structure 206). The epitaxy processes include CVD deposition techniques (e.g., vapor-phase epitaxy (VPE) and/or ultra-high vacuum CVD (UHV-CVD)), molecular beam epitaxy, and/or other suitable processes. The epitaxy process may use gaseous and/or liquid precursors, which interact with the composition of the fin structure 206 (e.g., silicon). In the present embodiment, the epitaxial layer 216 comprises silicon (Si) (i.e., Si epi layer 216), formed by a silicon epitaxial deposition process. Alternatively, the epitaxial layer 216 comprises silicon germanium (SiGe) (i.e., SiGe epi layer). The epitaxial layer 216 may be a doped epi layer, which may be doped during its deposition (growth) by adding impurities to the source material of the epitaxy process or subsequent to its deposition growth process by an ion implantation process. For example, a silicon epi layer may be doped with phosphorous (to form a Si:P epi layer). The doped epitaxial layer may have a gradient doping profile. Subsequently, a CMP process may be performed to planarize the epitaxial layer 216. It is understood that, in some examples, prior to forming the raised S/D regions, S/D regions of the fin structure 206, such as LDD and/or HDD S/D regions, may be formed in the openings.

Figure 2G:
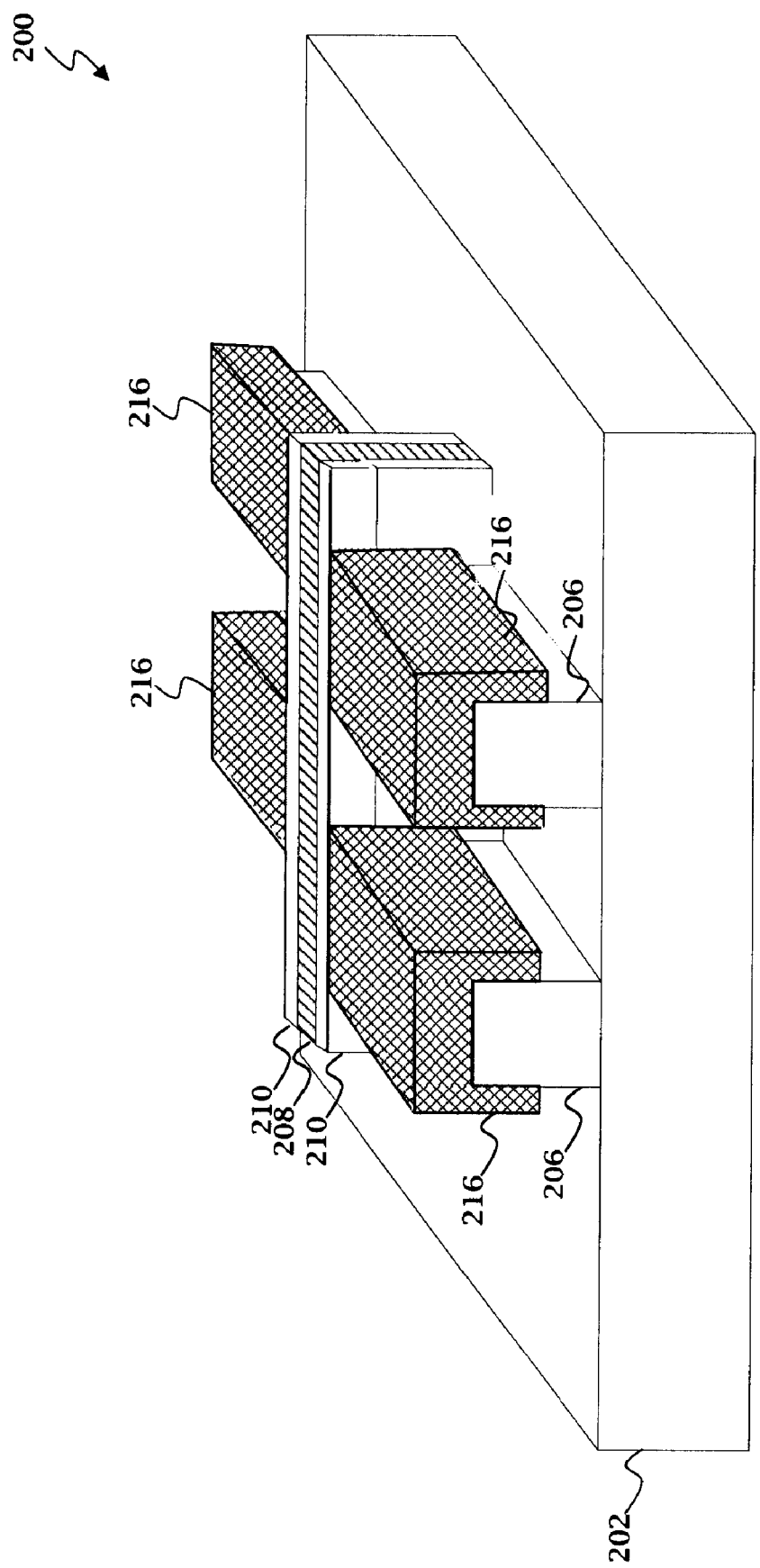

As illustrated in FIGS. 2F and 2G, when considering a sectional view of the FinFET device 200 taken along the channel of the device, the epitaxial layer 216 and/or fin structure 206 have a rectangular profile. The rectangular profile is similar to the profile illustrated by the cross-section of a fin structure having a raised source/drain region in FIG. 5B. The raised S/D regions (and/or epitaxial layer 216) have a top (first) surface, a right (second) sidewall surface, and a left (third) sidewall surface. The top surface of the raised S/D region is parallel to the top surface of the fin structure, and the right/left sidewall surfaces of the raised S/D region are perpendicular to the top surface of the raised S/D region. Furthermore, the top surface of the raised S/D regions and the top surface of the fin structure are parallel with the top surface of the substrate as well. Particularly, the top surface of the substrate has a first crystalline plane orientation, the second sidewall surface (the third sidewall surface as well) has a second crystalline plane orientation different from the first crystalline plane orientation. The channel is aligned in a direction parallel to both the top surface of the substrate and the second sidewall surface of the epitaxy layer. Stating differently, the channel is aligned in a direction defined by an intersection line between the first surface and the second surface.

In the present example, where the substrate 202 and/or fin structure 206 have a (001) crystallographic plane orientation, to achieve the rectangular profile, the top surface of the raised S/D region has a (001) crystal plane orientation and the left/right sidewall surfaces have a (110) crystal plane orientation. In other words, the channel and facet have the same crystallographic plane orientation, which is different from the crystallographic plane orientation of the substrate (e.g., wafer (001)/channel (110)/facet (110)).

At block 114, subsequent processing may be performed. Referring to FIG. 2G, the capping layer 212 is removed by any suitable process. The method 100 may continue to fabricate other features of the FinFET device 200, including for example, forming contacts, interconnect structures, and/or other suitable features and processes. The FinFET device 200 exhibits expanded salicidation areas, such that the later formed contacts exhibit reduced salicide contact resistance. The expanded salicidation areas are achieved by the method 100 providing the ability to vary the profile of the source and drain regions, particularly providing a square profile.

Figure 3:
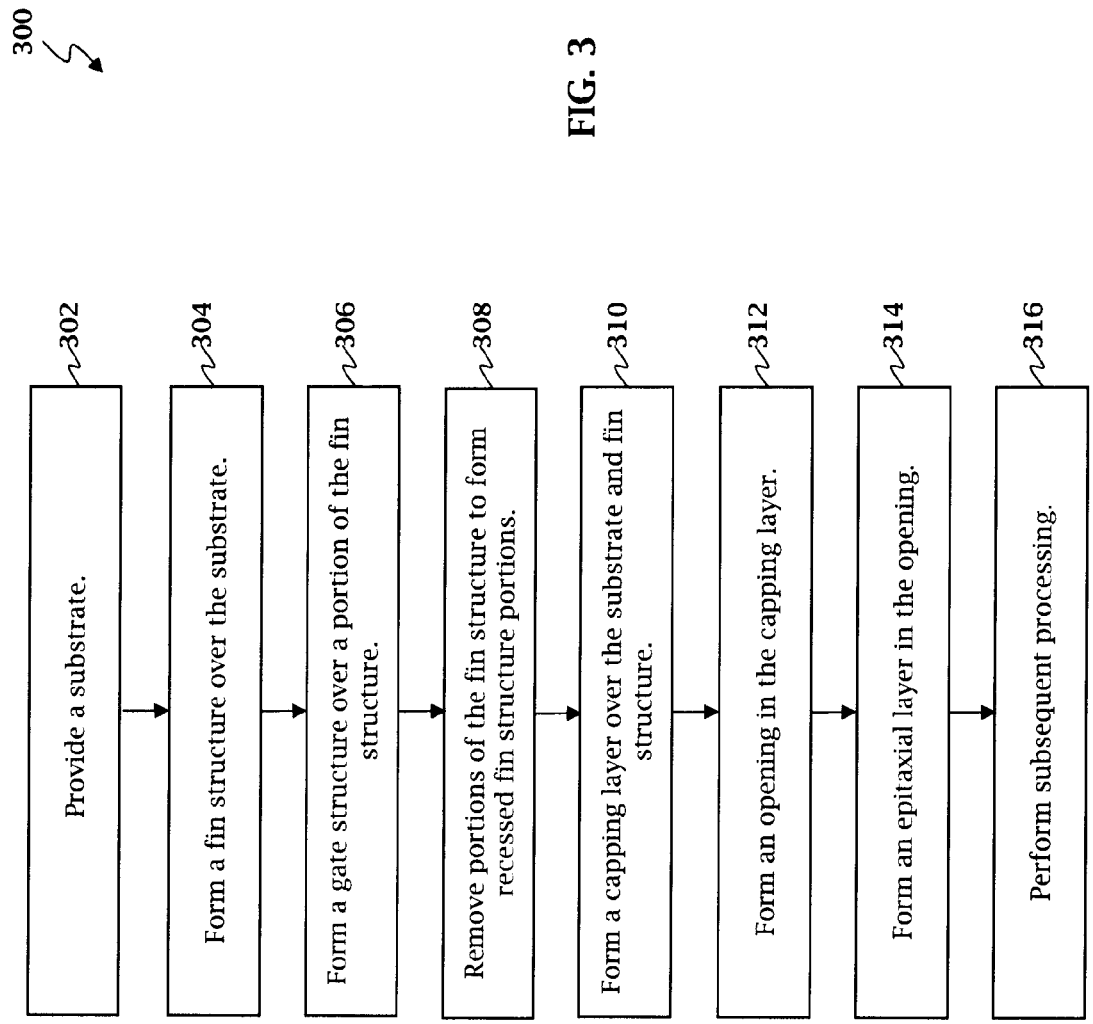
FIG. 3 is a flow chart of a method for fabricating an integrated circuit device according to aspects of the present disclosure.
Figure 4A:
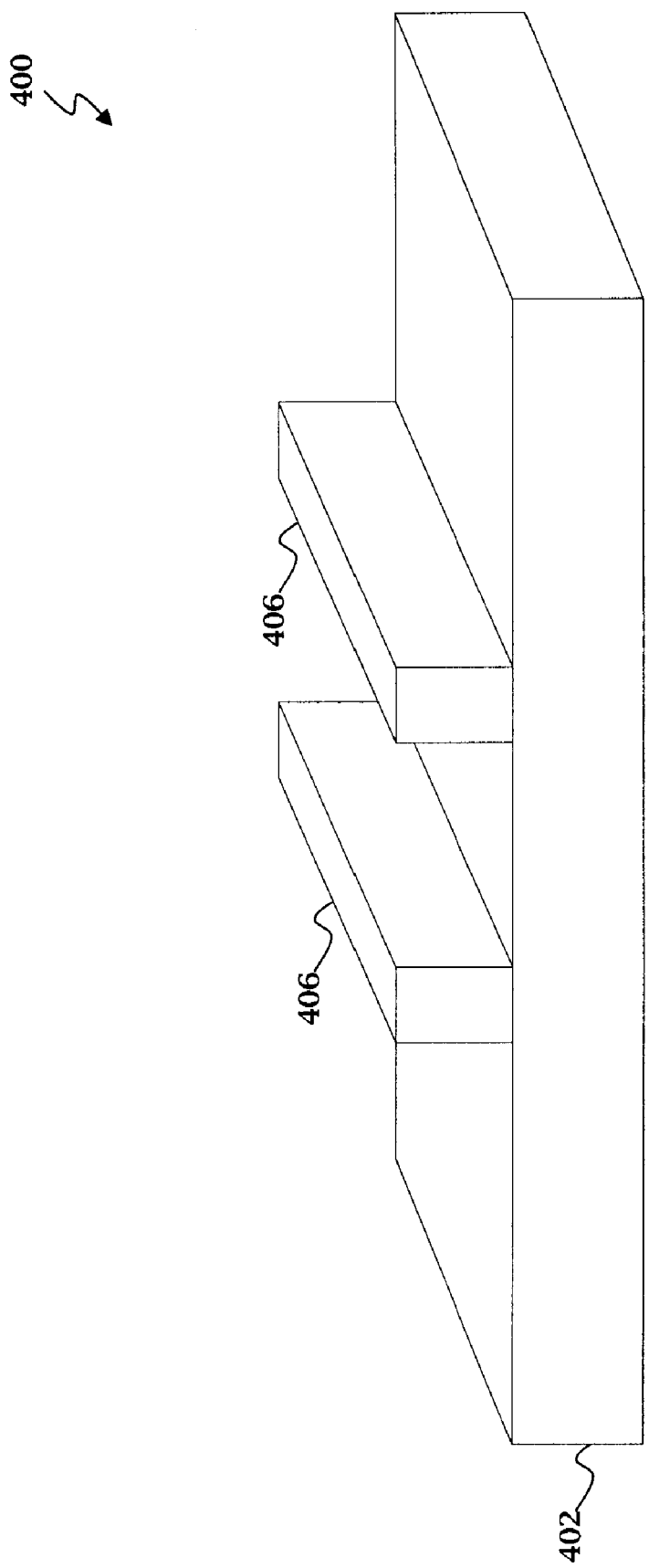
FIGS. 4A-4H are various cross-sectional views of embodiments of an integrated circuit device during various fabrication stages according to the method of FIG. 3.

FIG. 3 illustrates a flow chart of an embodiment of the method 300 to fabricate the FinFET device 400. Referring to FIGS. 3 and 4A, at block 302, a substrate (wafer) 402 is provided. The substrate 402 comprises silicon in a crystalline structure. The substrate 402 comprises any suitable crystallographic orientation (e.g., a (100), (110), or (111) crystallographic orientation). The substrate 402 may further include a notch aligned along any suitable direction (e.g., a <110> or <100> direction). In one embodiment, the substrate 402 includes a top surface having a (001) crystalline plane orientation. In the present embodiment, the substrate 402 comprises a (001) crystallographic orientation with a notch aligned in a <110> direction. Alternatively, the substrate 402 comprises other suitable elementary semiconductors, such as germanium in crystal; a compound semiconductor, such as silicon carbide, gallium arsenic, gallium phosphide, indium phosphide, indium arsenide, and/or indium antimonide; or combinations thereof. Alternatively, the substrate 402 includes a silicon-on-insulator (SOI) substrate. The SOI substrate can be fabricated using separation by implantation of oxygen (SIMOX), wafer bonding, and/or other suitable methods. The substrate 402 may include isolation regions, various doped regions, other suitable features, and/or combinations thereof.

At block 304, a fin structure 406 is formed over the substrate 402. The exemplary fin structure 406 comprises one or more fins. The fins comprise any suitable material, for example, the fin structure 406 comprises one or more silicon fins (Si-fin). As illustrated in FIG. 4A, the fin structure 406 exhibits a rectangular shape with a top surface that is parallel to a top surface of the substrate 402. Accordingly, the top surface of the fin structure 406 may have a (001) crystallographic plane orientation, similar to the substrate 402. The rectangular-shaped fin structure 406 can also include a right and left sidewall surfaces perpendicular to the top surfaces of the fin structure 406 and/or substrate 402.

The fin structure 406 is formed by any suitable process including various deposition, photolithography, and/or etching processes. An exemplary photolithography process may include forming a photoresist layer (resist) overlying the substrate (e.g., on a silicon layer), exposing the resist to a pattern, performing a post-exposure bake process, and developing the resist to form a masking element including the resist. The masking element may then be used to etch the fin structure into the silicon layer. The fin structure may be etched using reactive ion etching (RIE) processes and/or other suitable processes. In an example, the fin structure 406 may be formed, for example, by etching a layer of silicon on the substrate. The layer of silicon may be a silicon layer of a SOI substrate (e.g., overlying an insulator layer). The fin structure 406 may further include a capping layer disposed on the fins. The capping layer may include a silicon capping layer. It is understood that multiple parallel fin structures may be formed in a similar manner.

Alternatively, the fin structure 406 is formed by a double-patterning lithography (DPL) process. DPL is a method of constructing a pattern on a substrate by dividing the pattern into two interleaved patterns. DPL allows enhanced feature (e.g., fin) density. Various DPL methodologies may be used including double exposure (e.g., using two mask sets), forming spacers adjacent features and removing the features to provide a pattern of spacers, resist freezing, and/or other suitable processes.

Figure 4B:
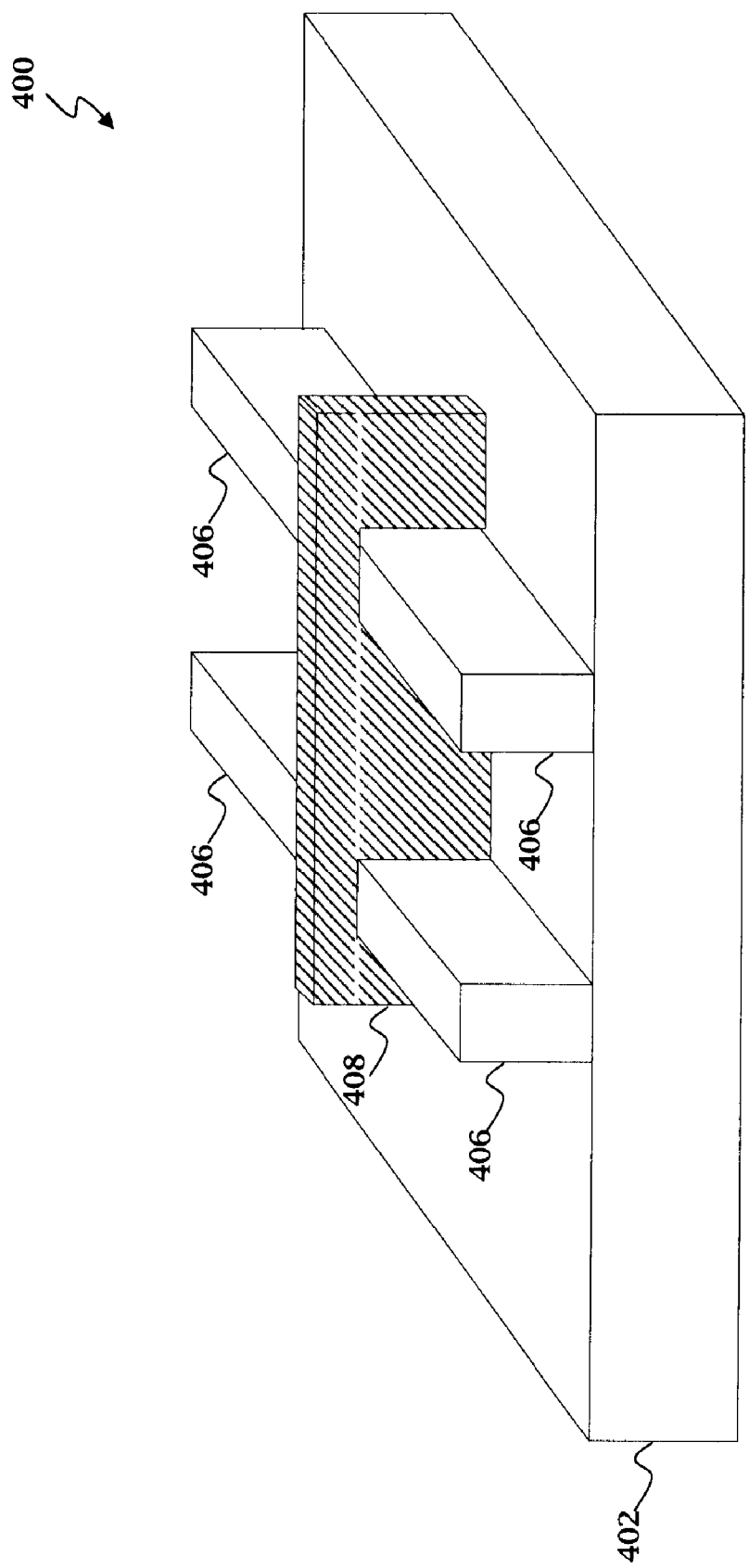

Referring to FIGS. 3 and 4B, at block 306, a gate structure 408 is formed over a portion of the fin structure 406. The gate structure 408 traverses the fin structure 406. In the present embodiment, the gate structure 408 is formed over a central portion of the fin structure 406. The gate structure 408 includes one or more material layers, such as interfacial layers, capping layers, diffusion/barrier layers, dielectric layers, electrode layers, conductive layers, other suitable layers, and/or combinations thereof. For example, the gate structure 408 may include a gate dielectric layer and a gate electrode. The gate dielectric layer comprises a dielectric material, such as silicon oxide, silicon nitride, high-k dielectric material, other suitable dielectric material, and/or combinations thereof. Examples of high-k dielectric materials include $HfO_2$, HfSiO, HfSiON, HfTaO, HfTiO, HfZrO, zirconium oxide, aluminum oxide, hafnium dioxide-alumina ($HfO_2$—$Al_2O_3$) alloy, other suitable high-k dielectric materials, and/or combinations thereof. The gate electrode includes any suitable material, such as polysilicon, aluminum, copper, titanium, tantalum, tungsten, molybdenum, tantalum nitride, nickel silicide, cobalt silicide, TiN, WN, TiAl, TiAlN, TaCN, TaC, TaSiN, metal alloys, other suitable materials, and/or combinations thereof.

The gate structure 408 is formed by any suitable process. For example, the gate structure 408 is formed by a procedure including deposition, photolithography patterning, and etching processes. The deposition processes include chemical vapor deposition (CVD), physical vapor deposition (PVD), atomic layer deposition (ALD), high density plasma CVD (HDPCVD), metal organic CVD (MOCVD), remote plasma CVD (RPCVD), plasma enhanced CVD (PECVD), low-pressure CVD (LPCVD), atomic layer CVD (ALCVD), atmospheric pressure CVD (APCVD), plating, other suitable methods, and/or combinations thereof. The photolithography patterning processes include photoresist coating (e.g., spin-on coating), soft baking, mask aligning, exposure, post-exposure baking, developing the photoresist, rinsing, drying (e.g., hard baking), other suitable processes, and/or combinations thereof. Alternatively, the photolithography exposing process is implemented or replaced by other proper methods such as maskless photolithography, electron-beam writing, and ion-beam writing. The etching processes include dry etching, wet etching, and/or other etching methods (e.g., reactive ion etching).

Figure 4C:
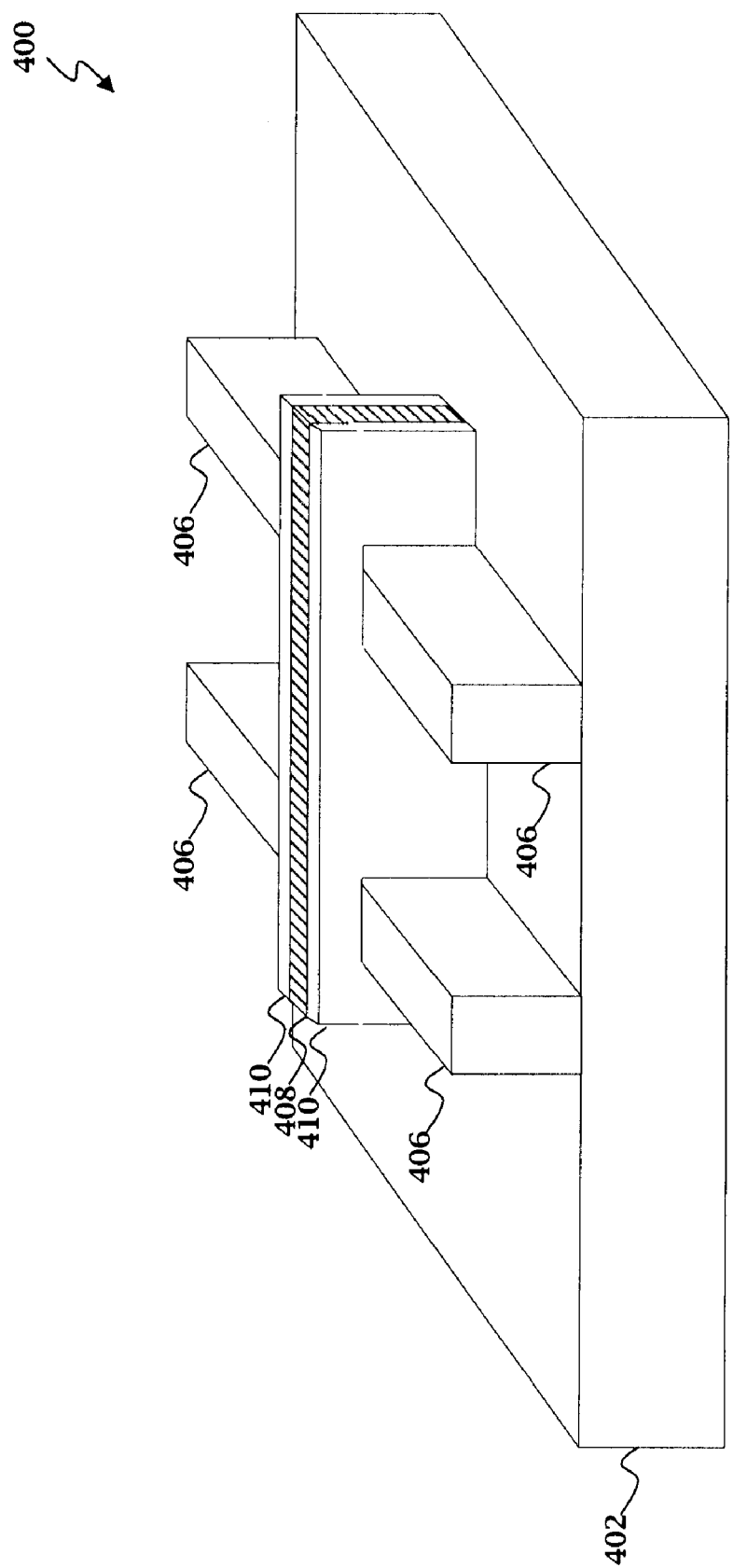

The gate structure 408 may further include spacers 410 as illustrated in FIG. 4C. The spacers 410 are formed by any suitable process to any suitable thickness. The spacers 410, which are positioned on each side of the gate structure 408, may comprise a nitride material (e.g., silicon nitride). In various examples, the spacers 410 comprise a dielectric material, such as silicon nitride, silicon carbide, silicon oxynitride, other suitable materials, and/or combinations thereof.

Various doped regions, such as source and drain (S/D) regions, can be formed in the fin structure 406. The S/D regions can include lightly doped S/D regions (LDD regions) and/or heavily doped S/D regions (HDD regions). The gate structure 408 traversing the fin structure 406 can separate the various doped regions. For example, the gate structure 408 can separate a source region and a drain region of the fin structure 406. The doping species may depend on the type of device being fabricated, such as an NMOS or PMOS device. The doping species include p-type dopants, such as boron or $BF_2$; n-type dopants, such as phosphorus or arsenic; and/or combinations thereof. The S/D regions may comprise various doping profiles. The doped regions may be formed by implantation processes, diffusion process, and/or other suitable processes. One or more annealing processes may be performed to activate the S/D regions. The annealing processes comprise rapid thermal annealing (RTA), laser annealing processes, and/or other suitable annealing processes.

Figure 4D:
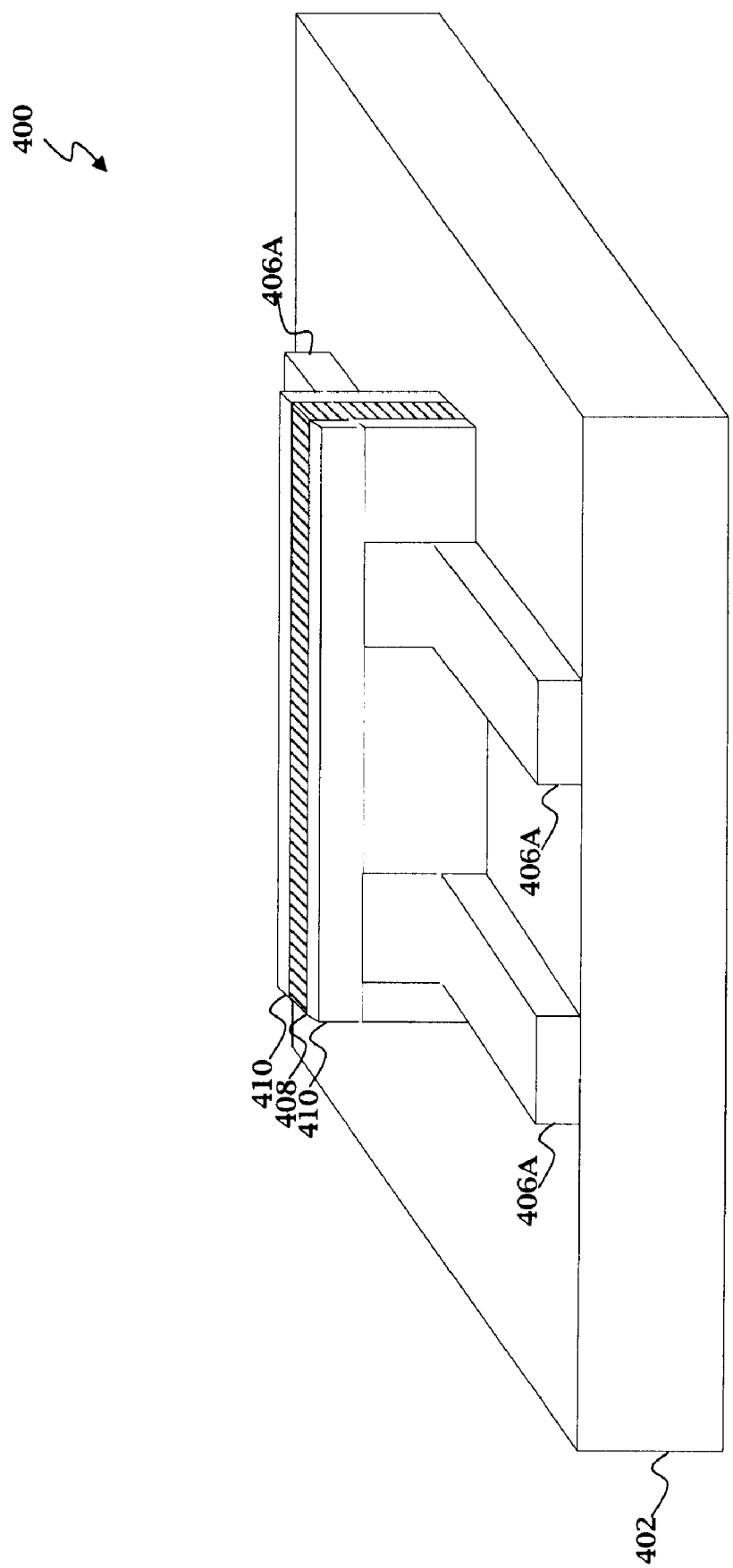

In the present example, at block 308, recessed fin structure portions are formed. As illustrated in FIG. 4D, portions of the fin structure 406 are removed to form recessed fin structure portions 406A. The portions of the fin structure 406 are removed by any suitable process, including patterning and etching processes as described herein.

As noted above, conventional processing of the FinFET device 400 would continue with performing a selective epitaxial growth/deposition process to form raised source/drain regions comprising epitaxially grown silicon (Si) or silicon germanium (SiGe), which can also be referred to as facets of the fin structure (e.g., Si and SiGe facets). It has been observed that conventional facets of the fin structure, such as the Si and SiGe facets, are unable to exhibit a rectangular profile following conventional processing. More particularly, it has been observed that epitaxially growing Si and SiGe facets cannot form a rectangular profile on a silicon substrate having a (001) crystallographic orientation with a notch aligned in a <110> direction. For example, FIG. 5A is a cross-sectional view of a fin structure along a channel of the fin structure, where the facets of the fin structure exhibit a diamond shaped profile, which often occurs in conventional processing. When the facets are grown on a silicon substrate having a (001) crystallographic plane orientation, the diamond shaped profile of FIG. 5A may have a top (first) surface with a (001) crystal plane and right/left (second/third) sidewall surfaces with a (111) crystal plane. In other words, the substrate, channel, and facet each have a different crystallographic orientation (e.g., wafer (001)/channel (110)/facet (111)).

Because conventional facets naturally grow in a diamond shape, fin structure height is limited by fin structure width. This adversely decreases an area available for later performed salicidation to form salicide contact areas, which also contributes to increased contact resistance. Improving the profile of the facets is difficult by varying process settings. Accordingly, an improved method for providing improved facet profile control is desired. The present disclosure proposes utilizing a damascene process to form the facets of the fin structure, i.e., the raised source/drain regions of the FinFET device. The damascene process can be utilized to form unique and/or arbitrary profiles of the fin structure including the facets. For example, FIG. 5B is a cross-sectional view of a fin structure along a channel of the fin structure, where the fin structure including the facets of the fin structure exhibit a rectangular-shaped profile.

Figure 4E:
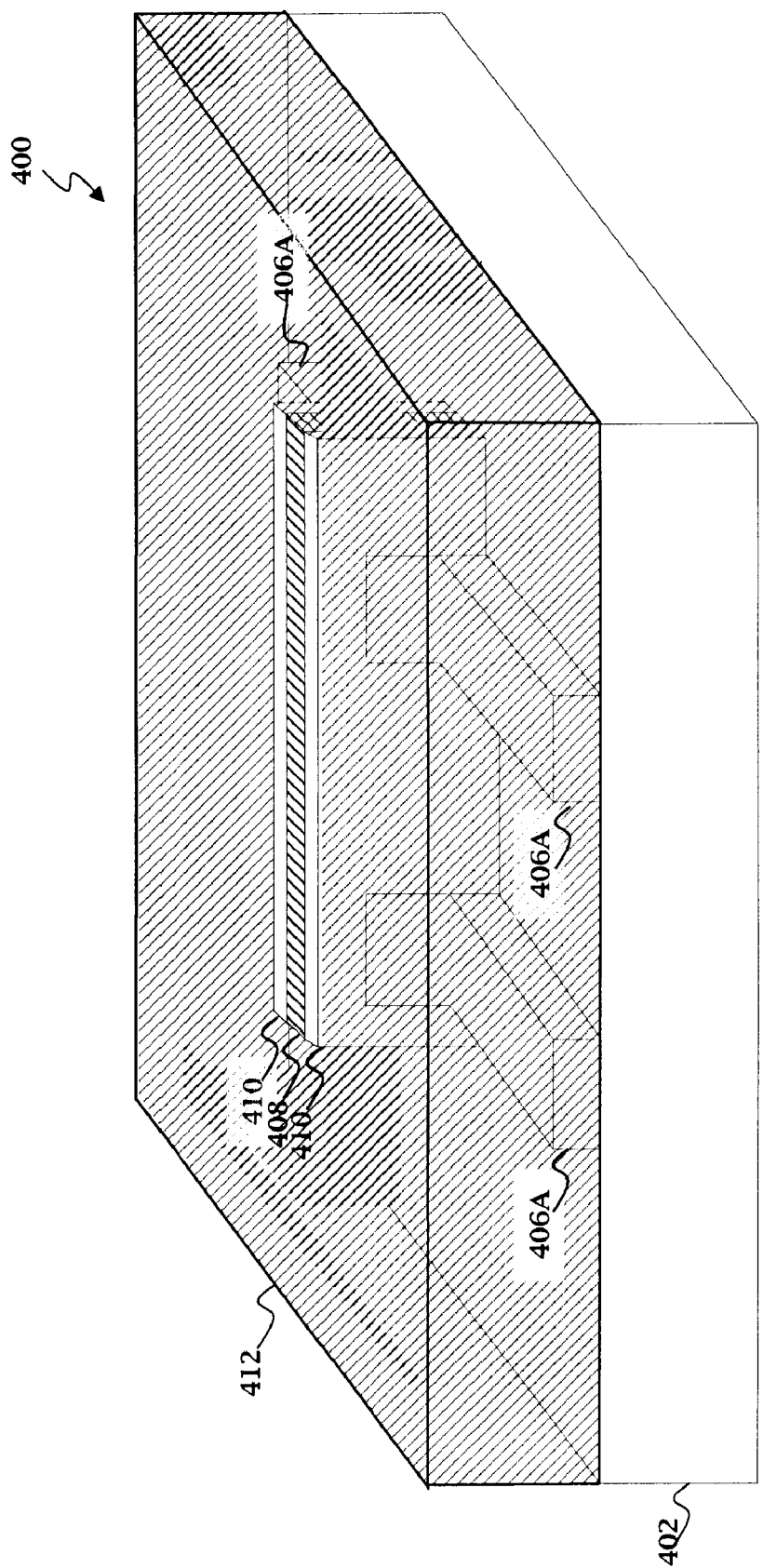
Figure 4F:
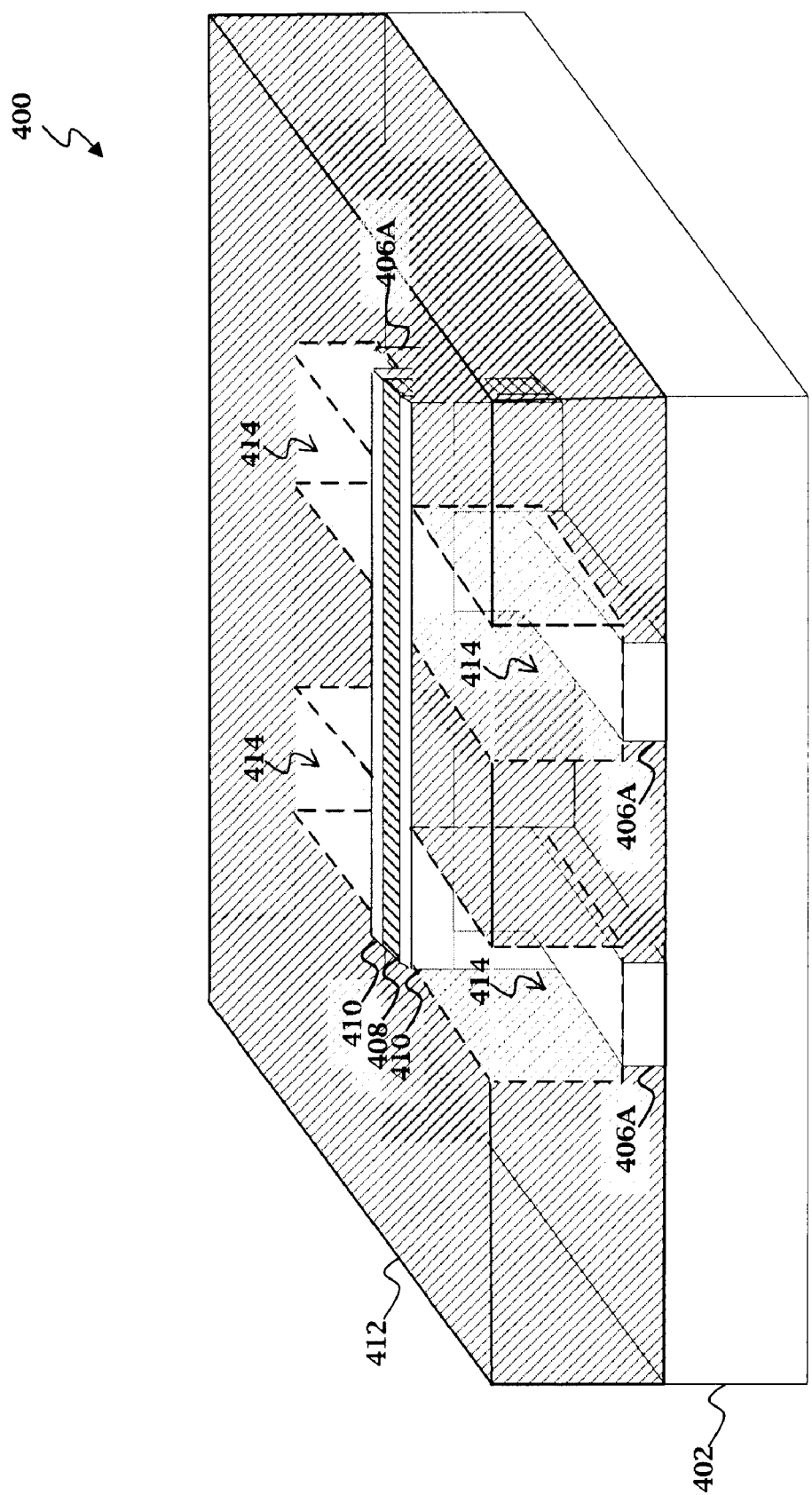

Referring to FIGS. 3 and 4E, at block 310, a capping layer is formed over the substrate and fin structure. In the present embodiment, a capping layer 412 is formed over the substrate 402, fin structure 406 (including recessed fin structure portions 406A), and gate structure 408 (including spacers 410). The capping layer 412 comprises any suitable material. An exemplary capping layer 412 is an oxide capping layer, such as silicon oxide or silicon oxynitride (SiON). Alternatively, the capping layer 412 includes other suitable materials, such as silicon nitride, SiC, SiOC, spin-on glass (SOG), a low-k film, tetraethylorthosilicate (TEOS) formed oxide, plasma enhanced CVD oxide (PE-oxide), high-aspect-ratio-process (HARP) formed oxide, or other suitable material. The capping layer 412 is formed by any suitable deposition process. Subsequently, one or more chemical mechanical polishing (CMP) processes are performed to planarize the capping layer 412 as illustrated in FIG. 4E. For example, the CMP process is performed until a portion of the gate structure 408 and spacers 410 are reached (which may expose a top portion of the gate structure 408 and spacers 410).

Figure 4G:
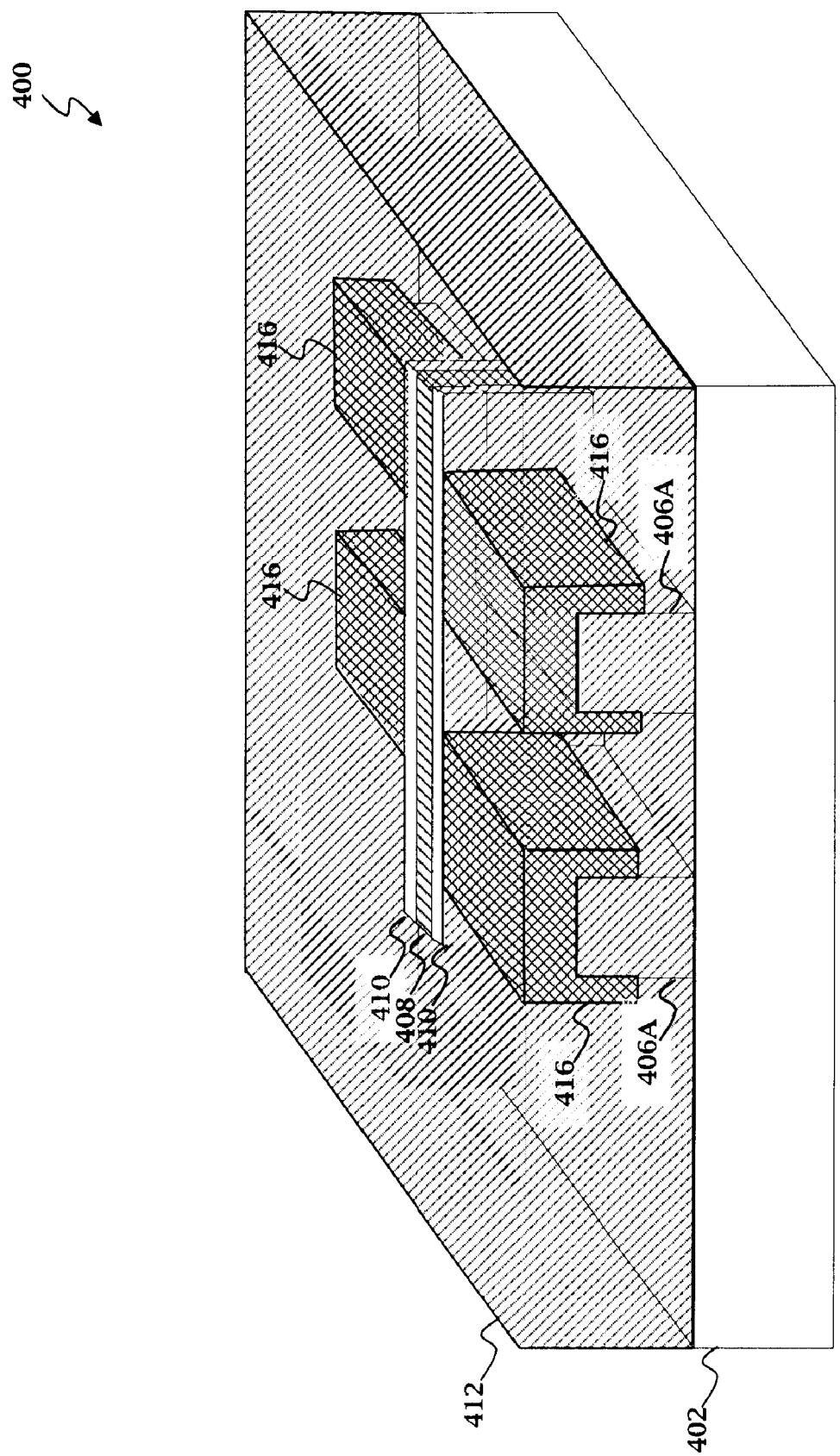

Referring to FIGS. 3 and 4G, at block 312, an opening is formed in the capping layer to define source and drain regions for the FinFET device 400. The source and drain regions may alternatively be referred to as facet portions of the fin structure 406, and thus, the opening in the capping layer defines a facet profile. For example, opening 414 is formed in the capping layer 412 by a combination of photolithography and etching processes. The opening 414 (comprising one or more openings in the present embodiment) defines source and drain (S/D) regions for the FinFET device 400. Thus, the capping layer 412 may be patterned to define various S/D profiles. The opening 414 also exposes portions of the fin structure 406

(here, the recessed portions of the fin structure 406A are exposed). The capping layer 412 may exhibit a different etching selectivity than the fin structure 406, such that etching of the capping layer 412 does not modify a profile of the fin structure 406 or damage the fin structure 406 (e.g., the fin structure 406 exhibits a higher etching resistance than the capping layer 412).

The photolithography patterning processes include photoresist coating (e.g., spin-on coating), soft baking, mask aligning, exposure, post-exposure baking, developing the photoresist, rinsing, drying (e.g., hard baking), other suitable processes, and/or combinations thereof. Alternatively, the photolithography exposing process is implemented or replaced by other proper methods such as maskless photolithography, electron-beam writing, and ion-beam writing. The etching processes include dry etching, wet etching, and/or other etching methods (e.g., reactive ion etching).

At block 314, raised source and drain regions are formed. For example, the opening 414 is filled with an epitaxial layer 416, which forms epitaxial layer 416 on the exposed portions of the fin structure 406 (i.e., recessed portions of the fin structure 406A, which may include S/D regions, such as those formed by an implantation process) as illustrated in FIG. 4G. The epitaxial layer 416 is grown in regions by one or more epitaxy or epitaxial (epi) processes where the capping layer 412 has been removed (e.g., in the present embodiment, within the opening 414 over portions of the fin structure 406). The epitaxy processes include CVD deposition techniques (e.g., vapor-phase epitaxy (VPE) and/or ultra-high vacuum CVD (UHV-CVD)), molecular beam epitaxy, and/or other suitable processes. The epitaxy process may use gaseous and/or liquid precursors, which interact with the composition of the fin structure 406 (e.g., silicon). In the present embodiment, the epitaxial layer 416 comprises silicon germanium (SiGe) (i.e., SiGe epi layer 416), formed by a silicon germanium epitaxial deposition process. Alternatively, the epitaxial layer 416 comprises silicon (Si) (i.e., Si epi layer). The epitaxial layer 416 may be a doped epi layer, which may be doped during its deposition (growth) by adding impurities to the source material of the epitaxy process or subsequent to its deposition growth process by an ion implantation process. The doped epitaxial layer may have a gradient doping profile. For example, a silicon epi layer may be doped with phosphorous (to form a Si:P epi layer). Subsequently, a CMP process may be performed to planarize the epitaxial layer 416. It is understood that, in some examples, prior to forming the raised S/D regions, S/D regions of the fin structure 406, such as LDD and/or HDD S/D regions, may be formed in the openings, using the capping layer 412 as a mask.

Figure 4H:
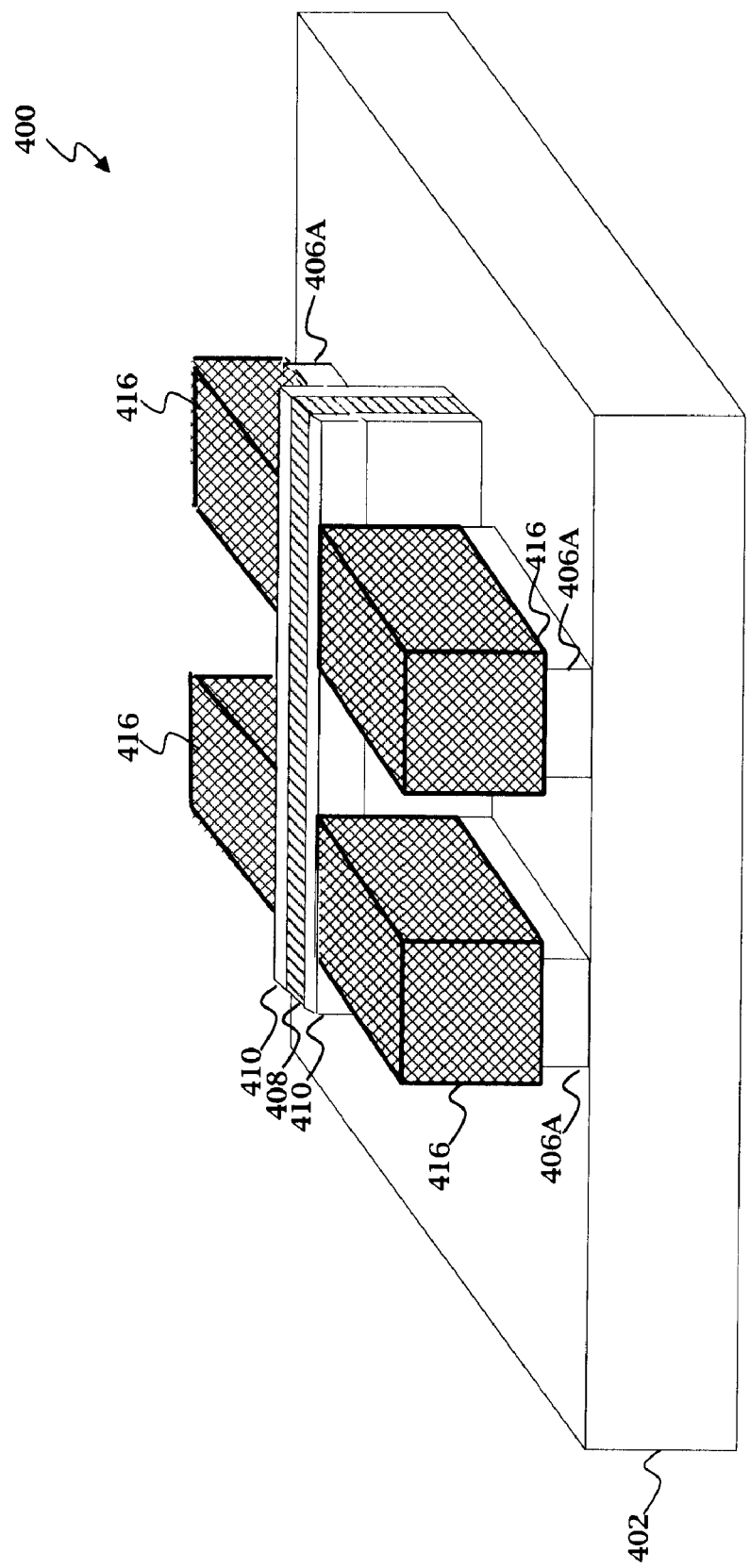

As illustrated in FIGS. 4G and 4H, when considering a sectional view of the FinFET device 400 taken along the channel of the device, the epitaxial layer 416 and/or fin structure 206 have a rectangular profile. The rectangular profile is similar to the profile illustrated by the cross-section of a fin structure having a raised source/drain region in FIG. 5B. The raised S/D regions (and/or epitaxial layer 416) have a top (first) surface, a right (second) sidewall surface, and a left (third) sidewall surface. The top surface of the raised S/D region is parallel to the top surface of the fin structure, and the right/left sidewall surfaces of the raised S/D region are perpendicular to the top surface of the raised S/D region. Furthermore, the top surface of the raised S/D regions and the top surface of the fin structure are parallel with the top surface of the substrate as well. Particularly, the top surface of the substrate has a first crystalline plane orientation, the second sidewall surface (the third sidewall surface as well) has a second crystalline plane orientation different from the first crystalline plane orientation. The channel is aligned in a direction parallel to both the top surface of the substrate and the second sidewall surface of the epitaxy layer. Stating differently, the channel is aligned in a direction defined by an intersection line between the first surface and the second surface.

In the present example, where the substrate 402 and/or fin structure 406 have a (001) crystallographic plane orientation, to achieve the rectangular profile, the top surface of the raised S/D region has a (001) crystal plane orientation and the left/right sidewall surfaces have a (110) crystal plane orientation. In other words, the channel and facet have the same crystallographic plane orientation, which is different from the crystallographic plane orientation of the substrate (e.g., wafer (001)/channel (110)/facet (110)).

At block 316, subsequent processing may be performed. Referring to FIG. 4H, the capping layer 412 is removed by any suitable process. The method 100 may continue to fabricate other features of the FinFET device 400, including for example, forming contacts, interconnect structures, and/or other suitable features and processes. The FinFET device 400 exhibits expanded salicidation areas, such that the later formed contacts exhibit reduced salicide contact resistance. The expanded salicidation areas are achieved by the method 300 providing the ability to vary the profile of the source and drain regions, particularly providing a square profile.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A FinFET device comprising:
   a substrate of a crystalline semiconductor material having a top surface of a first crystal plane orientation;
   a fin structure of the crystalline semiconductor material overlying the substrate;
   a gate structure over a first portion of the fin structure;
   an epitaxy layer over a second portion of the fin structure, wherein the epitaxy layer includes:
     a top surface of the epitaxy layer parallel with the top surface of the substrate; and
     a first surface and a second surface disposed as sidewall surfaces that are perpendicular to the top surface of the epitaxy layer; and wherein the first surface has a second crystal plane orientation, the second crystal plane orientation different than the first crystal plane orientation;
   wherein the epitaxy layer and underlying fin structure include a source and drain region, the source region being separated from the drain region by the gate structure; and
   a channel defined in the fin structure from the source region to the drain region, and aligned in a direction parallel to both the first surface of the epitaxy layer and the top surface of the substrate.

2. The FinFET device of claim 1 wherein the first crystal plane orientation is a (001) crystal plane orientation and the second crystal plane orientation is a (110) crystal plane orientation.

3. The FinFET device of claim 2 wherein the channel being parallel with the first surface of the epitaxy layer is aligned in the <110> direction.

4. The FinFET device of claim 1 wherein the epitaxy layer includes at least one of silicon or silicon germanium.

5. The FinFET device of claim 1 wherein the epitaxy layer includes silicon doped with a phosphorous doping species.

6. The FinFET device of claim 1 wherein the top surface of the epitaxial layer has the first crystal plane orientation and the two sidewall surfaces have the second crystal plane orientation.

7. The FinFET device of claim 1 wherein the crystalline semiconductor material is silicon.

8. The FinFET device of claim 1 wherein the epitaxy layer is formed by performing a damascene process that includes:
   forming a capping layer over the substrate, the fin structure, and the gate structure;
   patterning the capping layer to form an opening, wherein the opening exposes the second portion of the fin structure;
   growing the epitaxy layer in the opening on the exposed second portion of the fin structure; and
   removing the capping layer.

9. The FinFET device of claim 1 wherein the epitaxy layer is formed by performing a damascene process that includes:
   removing a third portion of the fin structure overlying the second portion of the fin structure, to form a recessed portion of the fin structure;
   forming a capping layer over the substrate, fin structure, and gate structure;
   patterning the capping layer to form an opening, wherein the opening exposes the recessed portion of the fin structure;
   growing the epitaxy layer in the opening on the exposed recessed portion of the fin structure; and
   removing the capping layer.

10. The FinFET device of claim 9 wherein the damascene process further includes performing an implantation process.

11. The FinFET device of claim 1 wherein the gate structure directly contacts the fin structure, and the gate structure includes a gate dielectric layer and a gate conductive layer on the gate dielectric layer.

12. A FinFET device comprising:
    a substrate including a fin structure, wherein the substrate is crystalline silicon and has a top surface with a first crystallographic plane orientation;
    a gate structure disposed on a portion of the fin structure, the gate structure traversing the fin structure;
    an epitaxy layer formed over another portion of the fin structure, wherein the epitaxy layer has first, second, and third surfaces, the first surface being parallel to the top surface of the substrate and the second and third surfaces being perpendicular to the first surface, and wherein the second and third surfaces each have a second crystallographic plane orientation different than the first crystallographic plane orientation; and
    a source region and drain region in the epitaxy layer that defines a channel in the fin structure from the source region to the drain region, the channel being aligned in a direction defined by an intersection line between the first surface and the second surface.

13. The FinFET device of claim 12 wherein the fin structure and the epitaxy layer have a rectangular profile in a sectional view along the channel.

14. The FinFET device of claim 12 wherein the first crystallographic plane orientation is a (001) crystal plane orientation, and the second crystallographic plane orientation is a (110) crystal plane orientation.

15. The FinFET device of claim 12 wherein the channel being aligned in the direction includes the channel being aligned in a <110> direction.

16. The FinFET device of claim 12 wherein the epitaxy layer comprises at least one of silicon and silicon germanium.

17. A FinFET device comprising:
    a semiconductor substrate having a fin structure disposed thereover, the fin structure having a top surface parallel to a top surface of the semiconductor substrate, the top surfaces having a (001) crystal plane orientation;
    a gate structure traversing the fin structure, the gate structure separating a source region and a drain region of the fin structure, wherein the source region and the drain region define a channel therebetween and are aligned in a <110> direction; and
    the source region and the drain region including an epitaxial layer having a top surface and two sidewall surfaces, wherein the top surface has a (001) crystal plane orientation, and the two sidewall surfaces can have a (110) crystal plane orientation.

18. The FinFET device of claim 17 wherein the epitaxy layer includes at least one of silicon and silicon germanium.

19. The FinFET device of claim 17 wherein the semiconductor substrate and the fin structure include silicon.

* * * * *